United States Patent [19]
Moh et al.

[11] Patent Number: 5,974,243
[45] Date of Patent: Oct. 26, 1999

[54] ADJUSTABLE AND SNAP BACK DESIGN-RULE HALOS FOR COMPUTER AIDED DESIGN SOFTWARE

[75] Inventors: David C. Moh, San Francisco, Calif.; Jack D. Benzel, Loveland; Michael J. Bennett, Timnath, both of Colo.

[73] Assignee: Hewlett-Packard Company, Palo Alto, Calif.

[21] Appl. No.: 08/961,973

[22] Filed: Oct. 31, 1997

[51] Int. Cl.$^6$ ..................................................... G06F 17/50
[52] U.S. Cl. .............................. 395/500.03; 395/500.09; 395/500.12; 345/438
[58] Field of Search .................................. 364/512, 578, 364/474, 464

[56] References Cited

U.S. PATENT DOCUMENTS

| | | | |
|---|---|---|---|
| 5,572,639 | 11/1996 | Gantt | 395/133 |
| 5,689,435 | 11/1997 | Umney et al. | 364/512 |
| 5,831,875 | 11/1998 | Hirata et al. | 364/578 |

OTHER PUBLICATIONS

Cadence 'Virtuoso Compactor', brief product description downloaded from internet, 1997.

Calence datasheet for, 'IC Craftsman Family' downloaded from internet, 1997.

Mentor Graphics 'AutoTherm', brief product description downloaded from internet extracted from Support Bulletin Issue 156, Dec. 1995.

Nedenstierna and Jeppson, 'The Halo Algorithm—An Algorithm for Hierarchical Design of Rule Checking of VLSI Circuits' IEEE Transction on Computer–Aided Design vol. 12, No. 2, Feb. 1993.

Mentor Graphics 'MCM Designer', brief product description downloaded from internet, 1997.

Mentor Graphics Technology Files Manual, Software Version 5.2_1;Dec. 1991; pp. 2–29,2–30 (Part No. 041869).

*Primary Examiner*—Kevin J. Teska
*Assistant Examiner*—Lonnie A. Knox
*Attorney, Agent, or Firm*—Morley C. Tobey, Jr.

[57] ABSTRACT

Enhanced capability design-rule halos for use in Computer Aided Design (CAD) software programs are described. Such enhanced halos, created around a design feature at the design rule distance from that feature, have the following characteristics: beveled corners for closer placement of adjacent non-parallel and/or non-perpendicular design features, level-to-level design rule halos, following a bend or turn in a design feature, the design rule halo automatically adapts to bends or turns in the design feature and associated changes in the design feature following the bend, following a bend or turn in a design feature, the design feature and the design rule halo automatically snap back, as required, to avoid a design rule violation with respect to an adjacent design feature, and the design-rule halo is prevented from extending closer to an adjacent design feature than the design rule distance. These actions are performed real-time and interactively.

34 Claims, 18 Drawing Sheets

ADJUSTABLE AND SNAP BACK DESIGN-RULE HALOS FOR COMPUTER AIDED DESIGN SOFTWARE

This application is related to copending application Ser. No. 08/962,579, filed the same day as this application titled "Multilevel & Beveled-Comer Design-Rule Halos for Computer Aided Design Software" and to copending application Ser. No, 08/961,672, filed the same day as this application titled "Forced Conformance Design-Rule Halos for Computer Aided Design Software".

BACKGROUND OF THE INVENTION

1. Field of the Invention

The present patent document relates generally to Computer Aided Design (CAD) software programs, and more specifically to CAD software programs used in the design of integrated circuits and printed circuit boards.

2. Description of Related Art

Computer Aided Design (CAD) software programs are used to create design drawings such as electrical schematics, line drawings, pictorial, and other representations of items which guide the manufacture of those structures depicted in the drawings. Depending upon the particular application, such drawings may be two or three dimensional representations of the subject item.

Such designs usually have to adhere to a set of predefined criteria, referred to as design rules, which are unique to the product, product type, or manufacturing process. Various techniques have been developed to ensure conformance to the design rules. These techniques include the use of design rule checking programs run subsequent to design creation and the use of interactive design rule checking procedures run continually during the design process.

Drawings of photomasks used in the manufacture of integrated circuits and printed circuit boards are composed of design features which define the geometries to be created or processed during specific process steps. For a given photomask, the design features must adhere to minimum design feature width and spacing rules applicable to that process step.

Such CAD systems often use a cursor to create, modify, and delete design features. Among other activities, modification includes stretching, shrinking, moving, and duplicating design features. The cursor is usually manipulated by means of a mouse, a track ball, or by pressing predefined keyboard keys, such as the up, down, left, and right arrow keys. The interactive nature of these systems aids in the timely creation of the design drawings.

Several problems exist with previous CAD software programs. For some design lay-outs, present systems indicate greater than the design rule minimum spacing for adjacent design features. There is also need for design-rule indication between features on two separate photomasks, i.e., inter-level or level-to-level. In addition, during design feature manipulation, it is possible to create features which violate design rules. Correction of such features is time consuming, expensive, and error prone. Thus, there is a significant need to improve the interactive, visual display of design rules and to include automatic conformance to design rules in CAD software systems.

SUMMARY OF THE INVENTION

Representative embodiments of the teachings of the present patent document provide enhanced capabilities not previously available to aid in conformance to design rules in Computer Aided Design (CAD) software programs. These capabilities are especially advantageous for CAD systems used to design photomasks for the fabrication of integrated circuits and printed circuit boards.

In a representative embodiment, a design-rule halo is created around a design feature at the design rule distance from that feature. The design-rule halo adjusts its outline to direction changes in the associated design feature. In another embodiment, when a direction change of a design feature creates a design rule violation, the design feature will snap back away from an adjacent design feature in order to force design rule conformance. These actions are performed real-time and interactively. Design rule violations are expensive and time consuming to correct. Thus, representative embodiments of the present patent document provide needed, enhanced capabilities not previously available.

Other aspects and advantages of the design-rule halos of the present patent document will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements and.

DESCRIPTION OF THE PREFERRED EMBODIMENT

Figure 1:
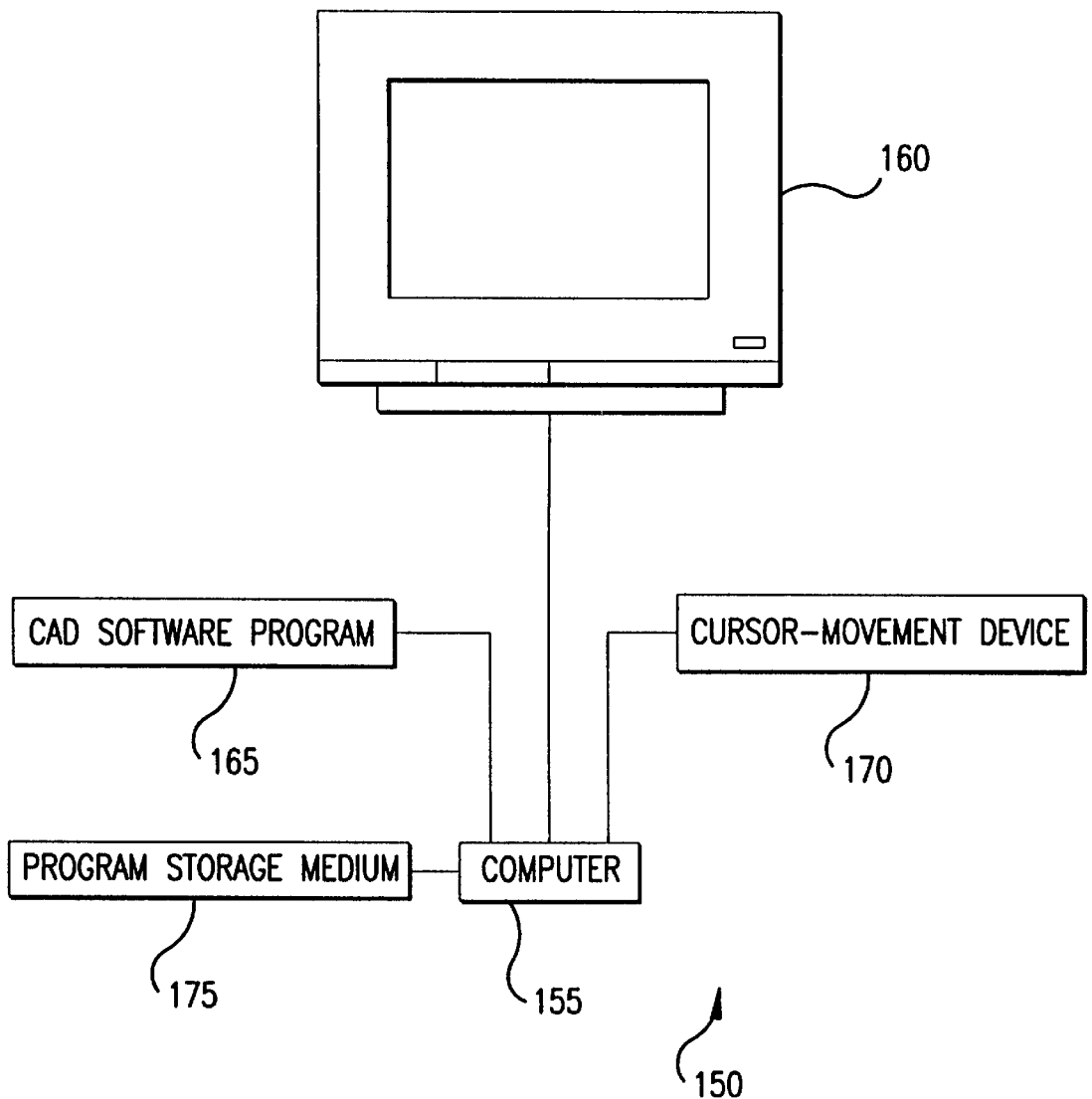
FIG. 1 is a drawing of a computer system as described in various representative embodiments of the present patent document.

As shown in the drawings for purposes of illustration, the present patent document relates to novel computer monitor displays of design-rule halos used in Computer Aided Design (CAD) software programs. Design-rule halos are visual aids created by CAD software programs to indicate minimum spacing requirements between related design features. In a typical application, the displayed outline of a design-rule halo will be displaced a design rule specified distance from its associated design feature. In the following detailed description and in the several figures of the drawings, like elements are identified with like reference numerals.

FIG. 1 is a drawing of a computer system 150 as described in various representative embodiments of the present patent document. In this figure, the computer system 150 comprises a computer 155 attached to a computer monitor 160, a program-storage medium 175, and a cursor-movement device 170. A CAD software program 165 for defining and displaying various design features and design-rule halos runs on the computer 155. The cursor-movement device 170 may be a mouse, a track ball, a computer keyboard wherein input could be obtained, for example, by pressing predefined keyboard keys, such as the up, down, left, and right arrow keys, or other input device.

Figure 2:
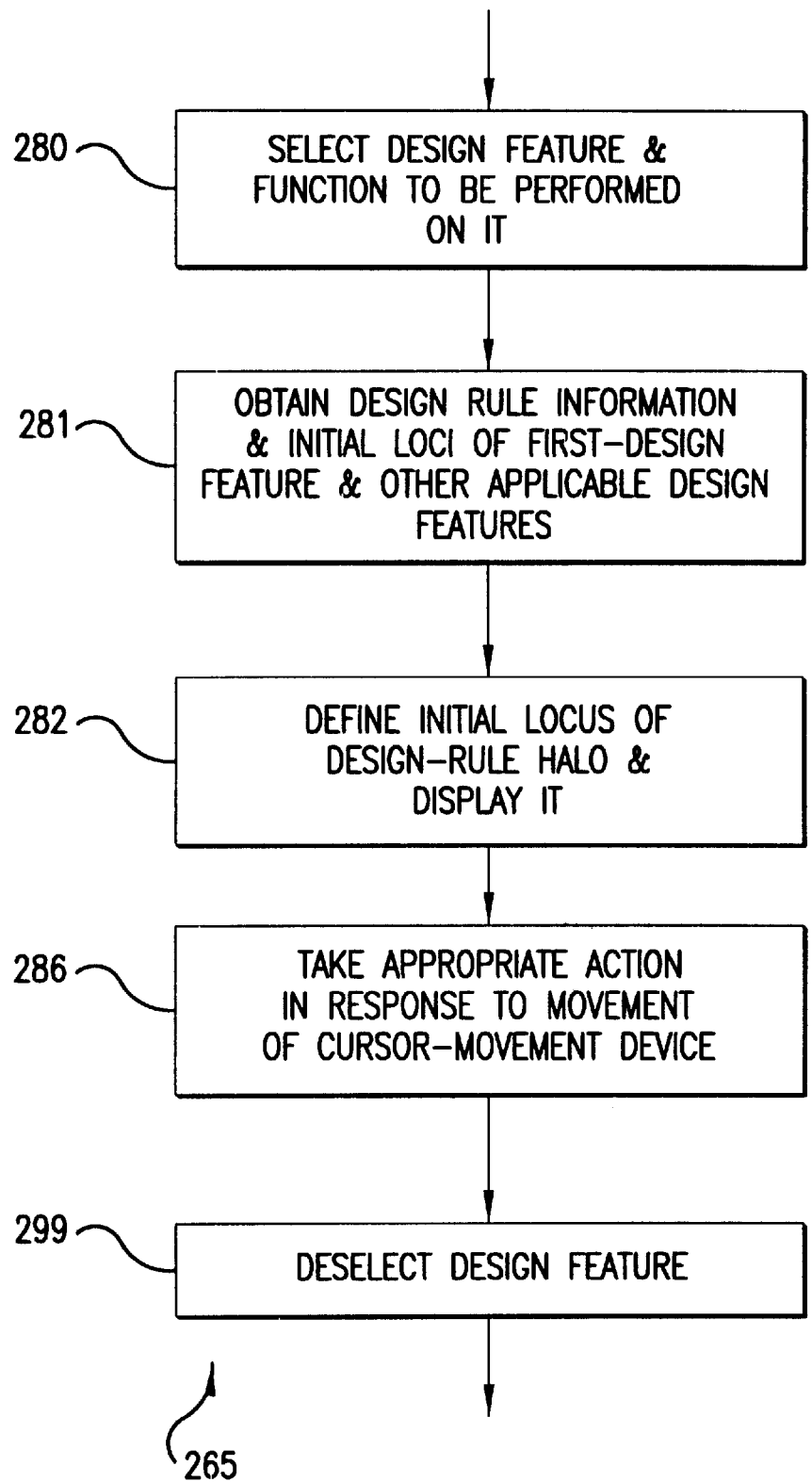
FIG. 2 is flow chart of a part of a CAD software program of a representative embodiment for creating, on a computer monitor, a design-rule halo.

FIG. 2 is a flow chart of steps taken in a representative embodiment of the CAD software program 165,265 used to define and display various design features and design rule indicators. This flow chart will be explained as it is used with the geometries of FIG. 3.

Figure 3:
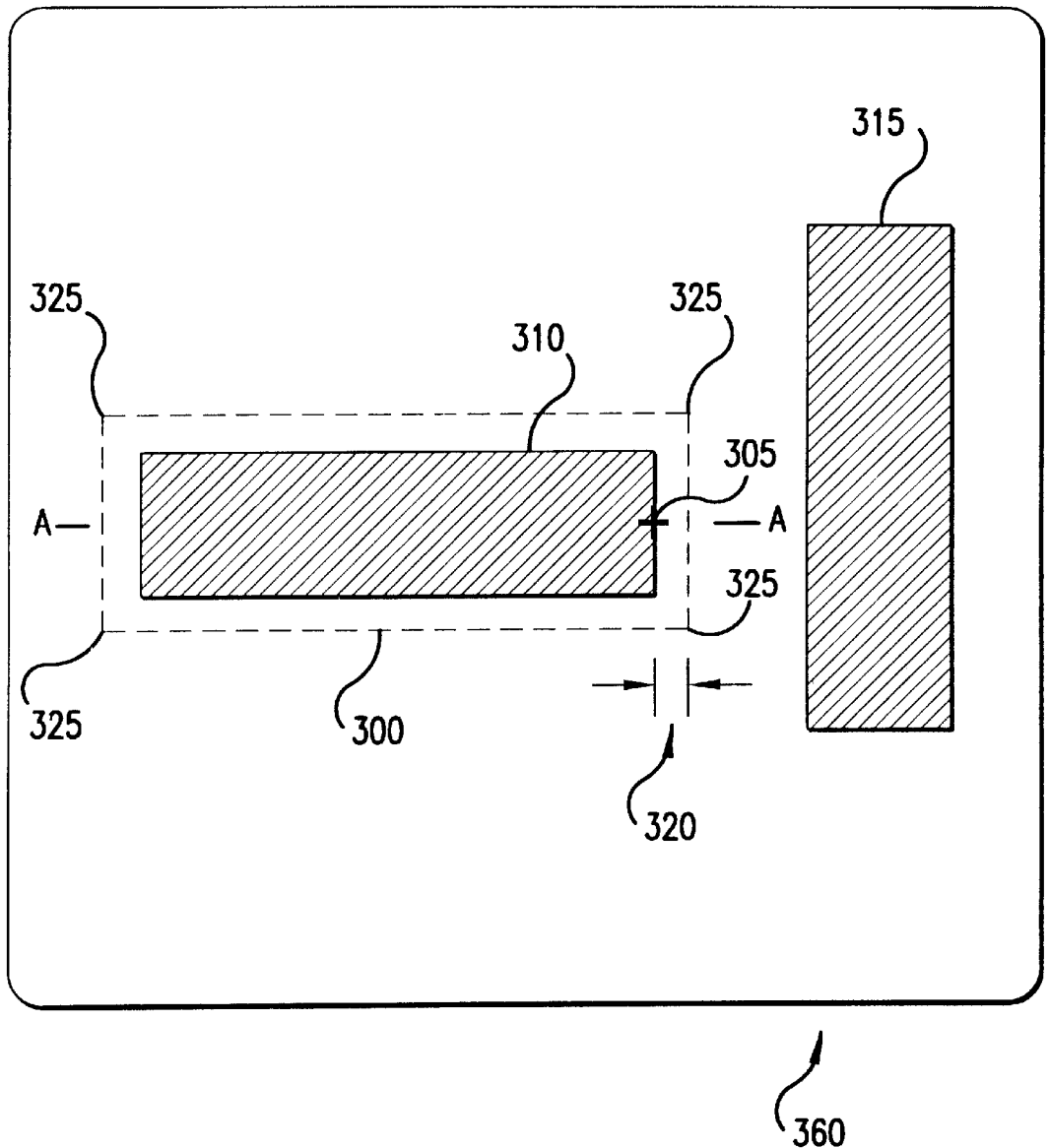
FIG. 3 is a drawing of a computer monitor display generated by a CAD software program showing a design-rule halo.

FIG. 3 is a drawing of the display of a computer monitor 160,360 created by a CAD software program 165,265 wherein a design-rule halo 300, having orthogonal corners 325, completely surrounds a first-design feature 310, also referred to as a design feature 310. A design-rule distance 320 between the design-rule halo 300 and the edge of the first-design feature 310 is a visual representation of the design rule minimum spacing between the first-design feature 310 and a second-design feature 315. The design-rule halo 300 aids in maintaining design rule conformance upon either resizing or movement of the first-design feature 310. The design-rule halo 300 expands or moves with the first-design feature 310. However, in this simple case the design feature can be only a rectangle, turns or bends in the feature are not allowed.

The steps of FIG. 2 could be contained within a procedure, subroutine, function, separately executable program, or for that matter a sequence of software commands in any form.

Block 280 in FIG. 2 selects the first-design feature 310 to be the active design feature and identifies the function to be performed by the CAD software program 165. Block 280 then transfers control to block 281.

Block 281 obtains the outline and location, also referred to as the locus, of the first-design feature 310 and all other design relevant features. In FIG. 3 the only other design relevant feature is the second-design feature 315. This block also obtains design rule information specifying the design-rule distance 320 between the first-design feature 310 and the design-rule halo 300. Block 281 then transfers control to block 282.

Block 282 uses the loci generated in Block 281 and the design-rule distance 320 to define the initial locus of the design-rule halo 300 and then to display it on the computer monitor 160. Block 282 then transfers control to block 286.

Block 286 takes the appropriate action in response to movement of the cursor-movement device 170. If the selected function of block 280 is design feature outline modification, the loci of the first-design feature 310 and its associated design-rule halo 300 will be modified in response to movement of the cursor-movement device 170. This movement could be, for example, stretching the first-design feature 310 with the cursor 305 moving to the right along the axis-of-motion A—A in FIG. 3. Block 286 continually updates and redisplays the first-design feature 310 and its associated design-rule halo 300 on the computer monitor 160 as the cursor-movement device 170 is moved by the operator. Other operations on the first-design feature 310 such as creating, movement of the cursor-movement device 170 in arbitrary directions, changes in location—often accomplished by dragging and dropping steps, copying, and deletion are also possible. Once the operator is satisfied with the changes in the first-design feature 310, block 286 transfers control to block 299.

Block 299 deselects the first-design feature 310 as the active design feature.

In a representative embodiment, the method steps described above may include a more extensive software program which could include the storage and retrieval of interrelated design features.

Figure 4:
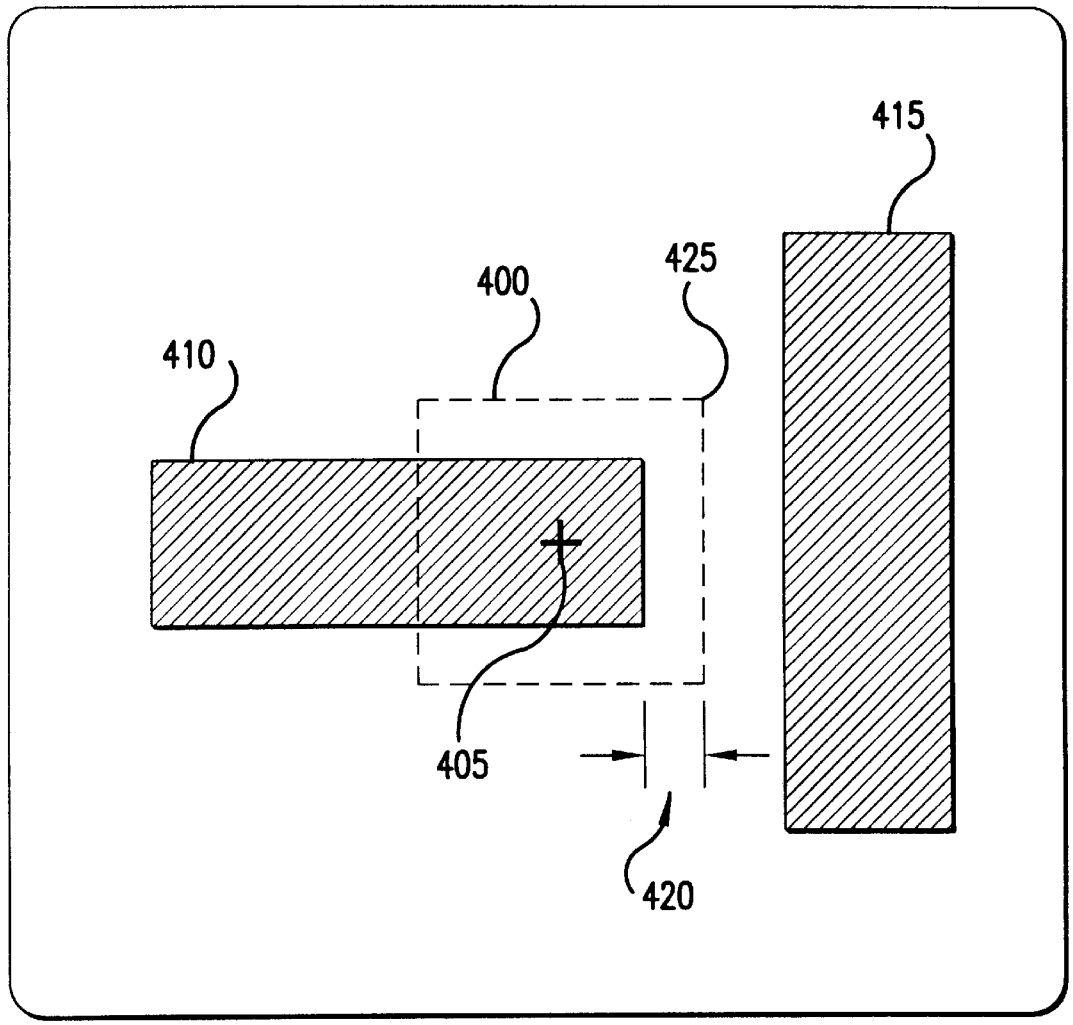
FIG. 4 is a drawing of a computer monitor display generated by a CAD software program showing another style design-rule halo.

FIG. 4 is a drawing of the display of a computer monitor 460 created by a CAD software program 165 showing another type of a design-rule halo 400, having an orthogonal corner 425. The design-rule halo 400 surrounds a cursor 405 which has been positioned near one end of a first-design feature 410. A design-rule distance 420 between the design-rule halo 400 and the edge of the first-design feature 410 is a visual representation of the design rule minimum spacing between the first-design feature 410 and a second-design feature 415. The design-rule halo 400 aids in maintaining design rule conformance upon either resizing or movement of the end of the first-design feature 410 near which the cursor 405 is located. However, the design-rule halo 400 is not active during movement of the first-design feature 410 from one location on the drawing to another. Thus, during and following movement of the first-design feature 410, visual indication of design rule conformance is lost. Activating the cursor 405 at a point on the design feature will restore the design-rule halo 400, but this restoration is time consuming, awkward, and error prone.

Figure 5A:
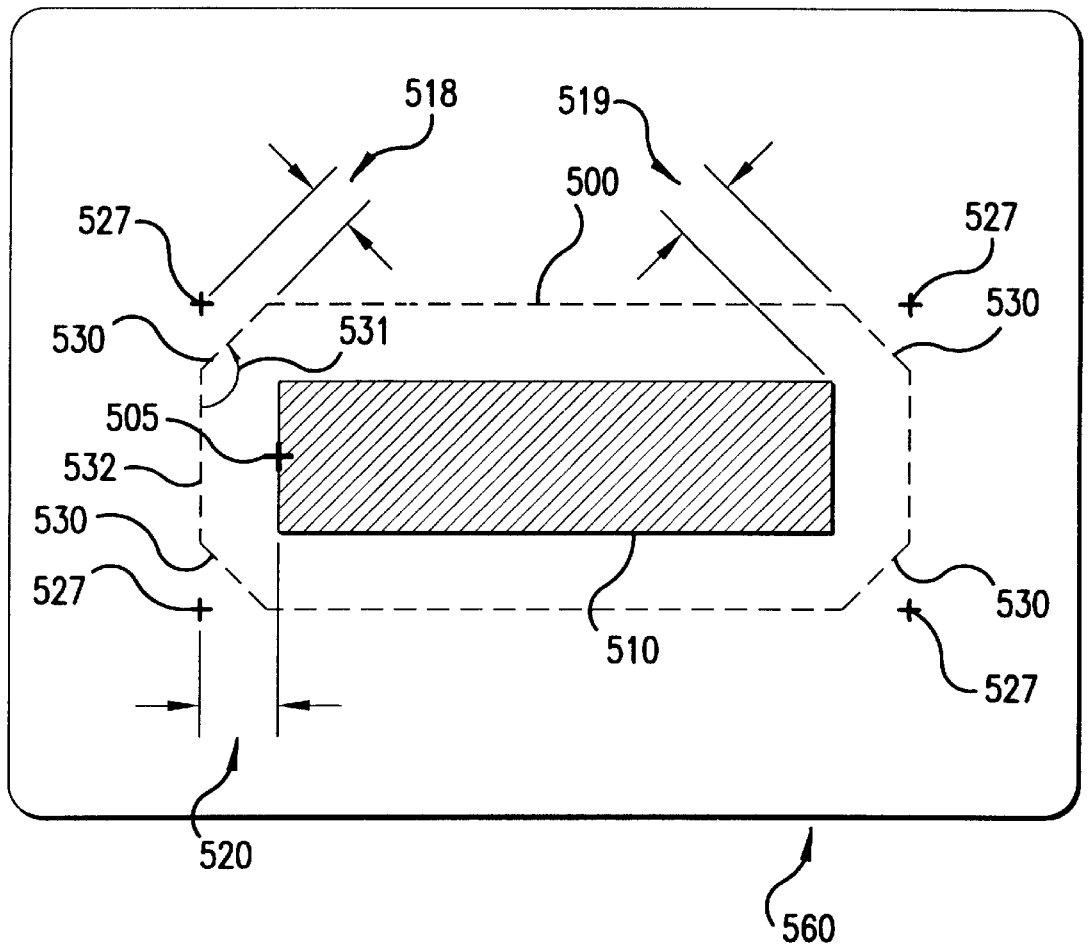
FIG. 5A is drawing of a computer monitor display generated by a CAD software program showing a design-rule halo having beveled comers.

In another representative embodiment, FIG. 5A is a drawing of the display of a computer monitor 560 generated by CAD software program 165, 265. In this drawing, a first-design feature 510, also referred to as a design-feature 510, drawn on the computer monitor 560 is shown with a cursor 505 and a design-rule halo 500, also referred to as a beveled-corner-design-rule halo 500, drawn around the first-design feature 510 at a design-rule distance 520 from the first-design feature 510. The design-rule halo 500 has a beveled corner 530 at each of its corners. The beveled corners 530 are beveled at a bevel angle 531 which is the angle measured between an adjacent side 532 and the beveled corner 530. The beveled corners are located a beveled-corner distance 519 from the first-design feature 510. In order to conform to the design rules, the beveled-corner distance 519 should be greater than or equal to the design-rule distance 520. The bevel angle 531 is greater than 90 degrees and less than 180 degrees. Without the beveled corners 530, the design-rule halo 500 would have had a corner vertex 527 at each of its orthogonal corners, and the design-rule halo 500 would have extended a distance 518 beyond its present boundary at each of the beveled corners 530.

Figure 5B:
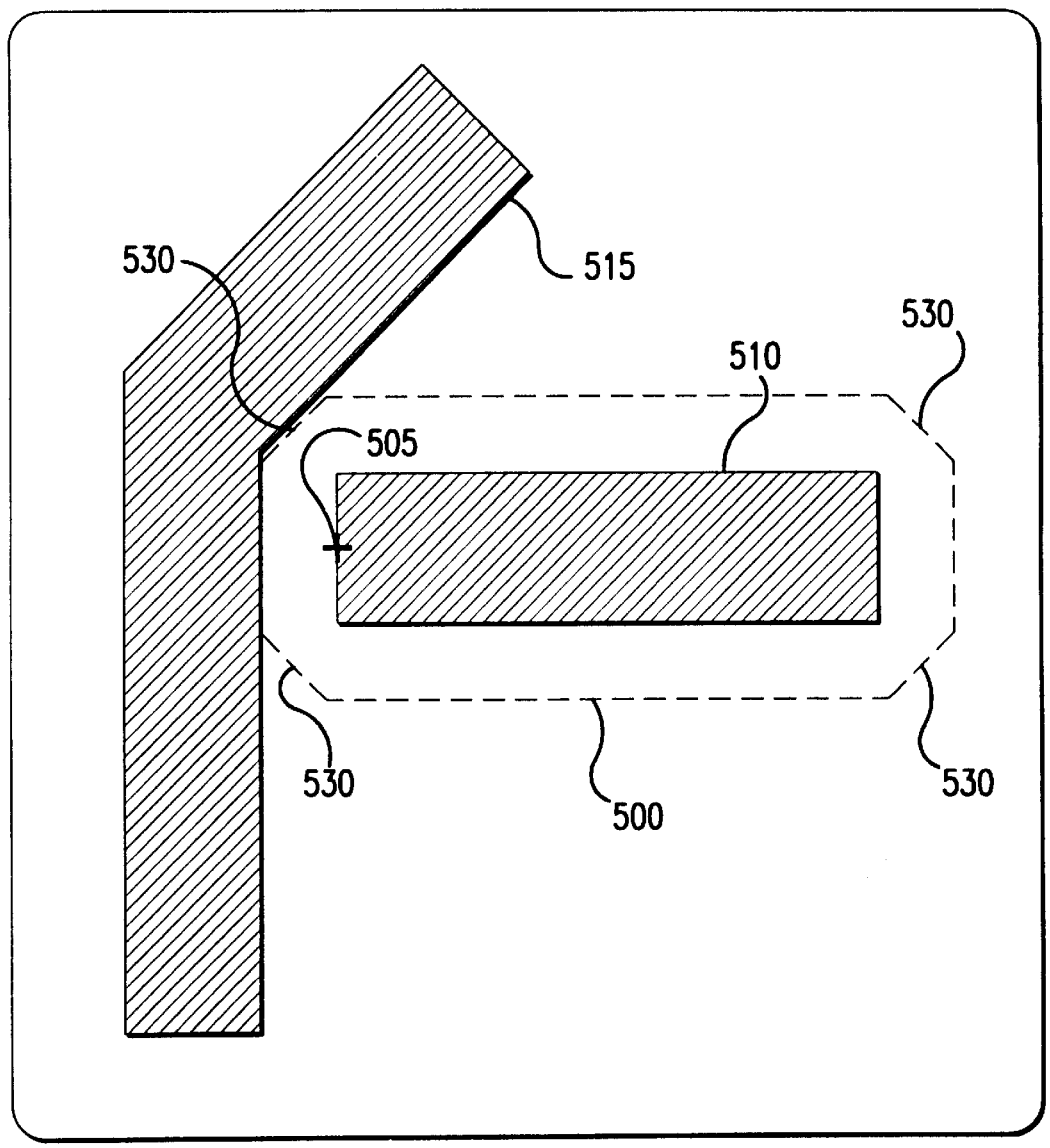
FIG. 5B is drawing of a computer monitor display generated by a CAD software program showing a design-rule halo having beveled comers with the halo's non-orthogonal relationship to another design feature.

FIG. 5B is another drawing of the display of the computer monitor 560 generated by the CAD software program 165, 265 with the first-design feature 510 placed at the minimum design rule distance from a second-design feature 515, some of the sides of the first-design feature 510 and the second-design feature 515 being non-parallel and non-ortihogonal to each other. As can be seen from FIGS. 5A and 5B, without the design-rule halo 500 overlapping the second-design feature 515, the first-design feature 510 is placed closer to the second-design feature 515 by the distance 518, than it would have been had the beveled corner 530 been orthogonal instead.

In this representative embodiment, block 282 of FIG. 2 uses the design rule information obtained in block 280 to define the initial locus on the computer monitor 160,560 of the design-rule halo 500 having beveled corners 530.

Figure 5C:
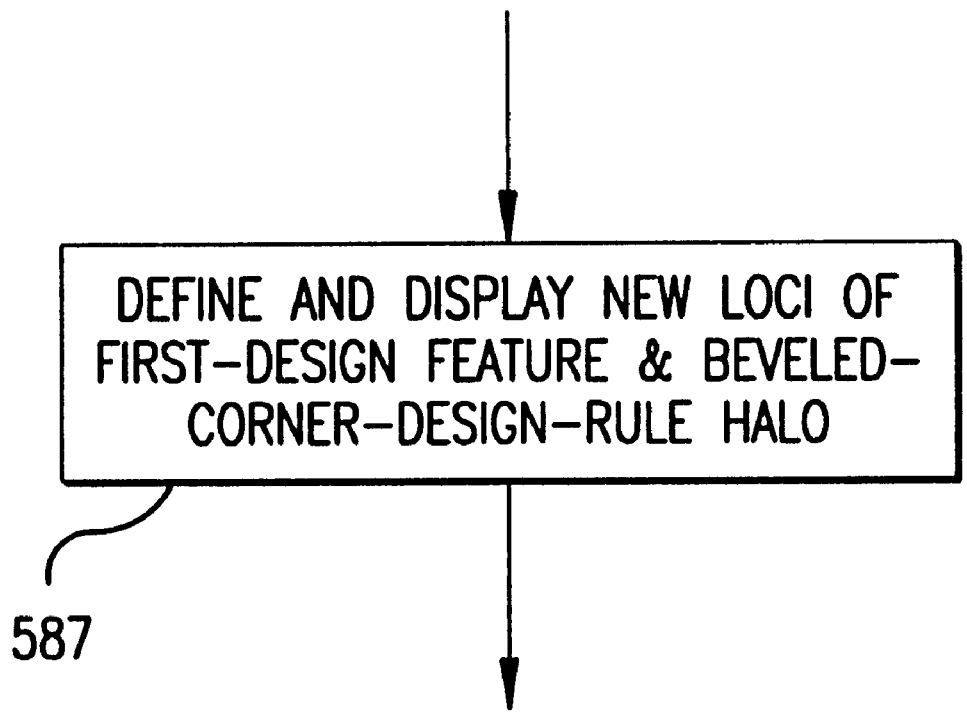
FIG. 5C is a flow chart of a part of a CAD software program of a representative embodiment for creating, on a computer monitor, a design-rule halo having beveled comers.

Block 286 of the flow chart is further defined by block 587 of the flow chart in FIG. 5C. Block 587 defines and displays new loci for the first-design feature 510 and the beveled-corner-design-rule halo 500 following movement of the cursor-movement device 170. Possible actions include, but are not limited to, creation, movement of the cursor-movement device 170 in arbitrary directions, changes in size, changes in location—often accomplished by dragging and dropping, creation, copying, and deletion of the first-design feature 510 and the design-rule halo 500. Program execution continues by looping through block 587 until the selected operation is completed by the operator. Block 587 then transfers control to block 299 shown in FIG. 2.

In a representative embodiment, the method steps described above may include a more extensive software program which could include, for example, other operations such as storage and retrieval of interrelated design features, as well as those operations mentioned above. In the event of a design rule violation, the method steps described above also may include providing various visual indications of such including alternately changing the intensity of the design-rule halo 500, changing the color of the design-rule halo 500, changing the line pattern of the design-rule halo 500 outline, changing the design-rule halo 500 fill pattern, and providing a message to the user indicating which design rule has been violated. Additionally, in the event of a design rule violation, the method steps described above may include providing various audio indications of such including a sound of varying intensity, the sound of a bell, the sound of a whistle, and a message delivered by recorded voice.

Figure 6A:
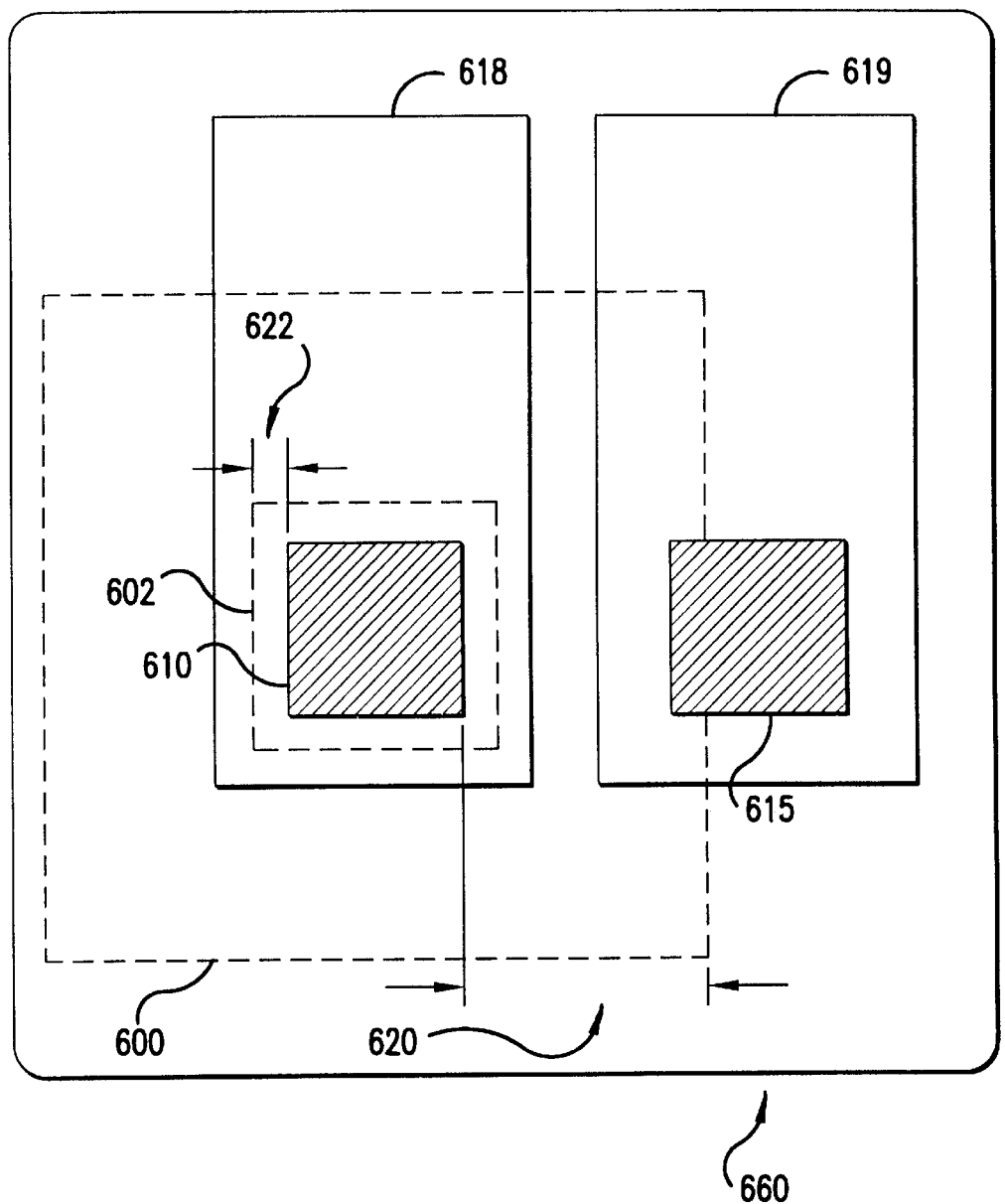
FIG. 6A is a drawing of a computer monitor display generated by a CAD software program showing a design-rule halo for level-to-level design rules.

In another representative embodiment, FIG. 6A is a drawing of the display of a computer monitor 660 generated by the CAD software program 165,265. The computer monitor 660 of this figure shows design features from two different levels. The first level which for this figure could be the contact level photomask used for the manufacture of an integrated circuit, and the second level could be the metal level photomask. Two contacts on the contact level are designated as a level-one-first-design feature 610 and a level-one-second-design feature 615. Two metal traces on the metal level are designated as a level-two-first-design feature 618 and a level-two-second-design feature 619. Surrounding the level-one-first-design feature 610 is an intra-level-design-rule halo 600 separated from the level-one-first-design feature 610 by an intra-level-design-rule distance 620 which is the closest distance that two contacts on the contact level can be placed and still meet minimum design rule specification. Also, shown on this display is an inter-level-design-rule halo 602 surrounding the level-one-first-design feature 610 separated from the level-one-first-design feature 610 by an inter-level-design-rule distance 622 which is the closest distance that a contact on the contact level can be placed to the edge of a metal trace on the metal level and still meet minimum design rule specification. Note that as shown in FIG. 6A, the level-one-first-design feature 610 and the level-one-second-design feature 615 violate the minimum spacing requirement as indicated by the fact that a part of the level-one-second-design feature 615 lies within the boundary of the intra-level-design-rule halo 600. However, the spacing between the level-one-first-design feature 610 and the edge of the level-two-first-design feature 618 does meet the design rule specification as indicated by the inter-level-design-rule halo 602.

Use of different patterns and/or colors on the computer monitor 660 could be used to more easily distinguish between the intra-level-design-rule halo 600 and the interlevel-design-rule halo 602.

The level-one-first-design feature 610 also is referred to herein as the design feature 610. And, the inter-level-design-rule halo 602 also is referred to as the level-to-level design-rule halo 602.

In this representative embodiment, block 282 of FIG. 2 uses the design rule information obtained in block 280 to define the initial locus on the computer monitor 160,660 of the level-to-level design-rule halo 602.

Figure 6B:
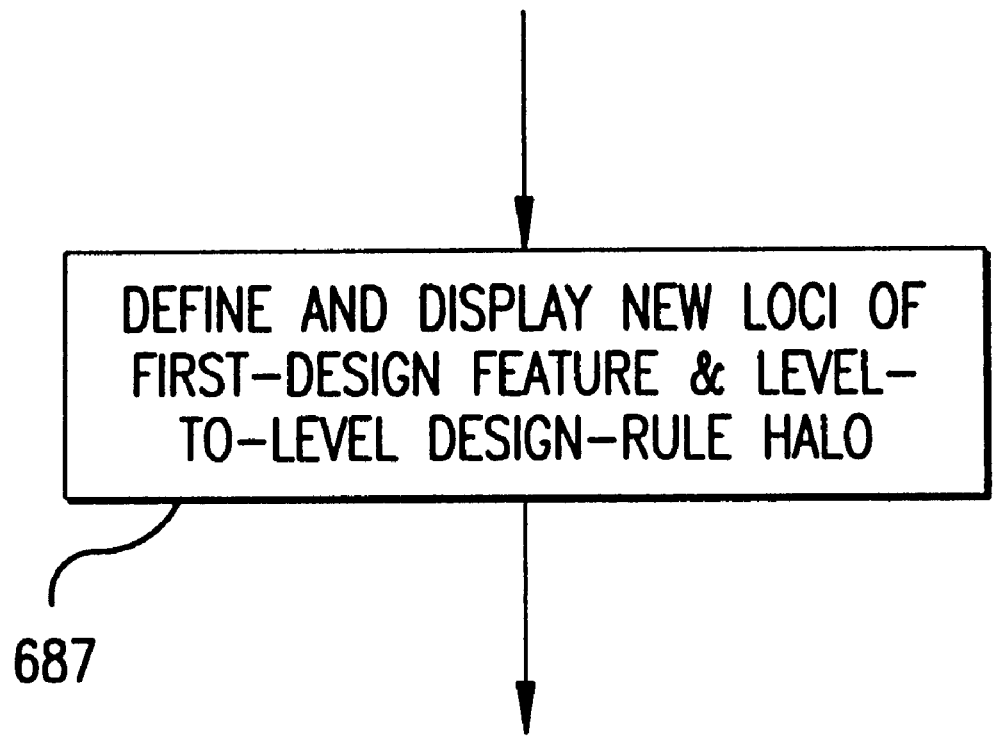
FIG. 6B is a flow chart of a part of a CAD software program of a representative embodiment for creating, on a computer monitor, a design-rule halo indicating level-to-level design rules.

Block 286 of the flow chart is further defined by block 687 of the flow chart in FIG. 6B. Block 687 defines and displays new loci for the first-design feature 610, the level-to-level design-rule halo 602, and any other related geometries such as the inter-level design-rule halo 600 following movement of the cursor-movement device 170. Possible actions include, but are not limited to, creation, movement of the cursor-movement device 170 in arbitrary directions, changes in size, changes in location—often accomplished by dragging and dropping, copying, and deletion of the first-design feature 610, the level-to-level design-rule halo 602, and the inter-level design-rule halo 600. Program execution continues by looping through block 687 until the selected operation is completed by the operator. Block 687 then transfers control to block 299 shown in FIG. 2.

In a representative embodiment, the method steps described above may include a more extensive software program which could include, for example, other method steps such as storage and retrieval of interrelated design features as well as those mentioned above. In the event of an inter-level or intra-level design rule violation, the method steps described above also may include providing various visual indications of such including alternately changing the intensity of the intra-level-design-rule halo 600 or the inter-level-design-rule halo 602 as appropriate, changing the color of the intra-level-design-rule halo 600 or the inter-level-design-rule halo 602 as appropriate, changing the line pattern of the intra-level-design-rule halo 600 outline or the inter-level-design-rule halo 602 outline as appropriate, changing the intra-level-design-rule halo 600 fill pattern or the inter-level-design-rule halo 602 fill pattern as appropriate, and providing a message to the user indicating which design rule has been violated. Additionally, in the event of a design rule violation, the method steps described above may include providing various audio indications of such including a sound of varying intensity, the sound of a bell, the sound of a whistle, and a message delivered by recorded voice.

Figure 7A:
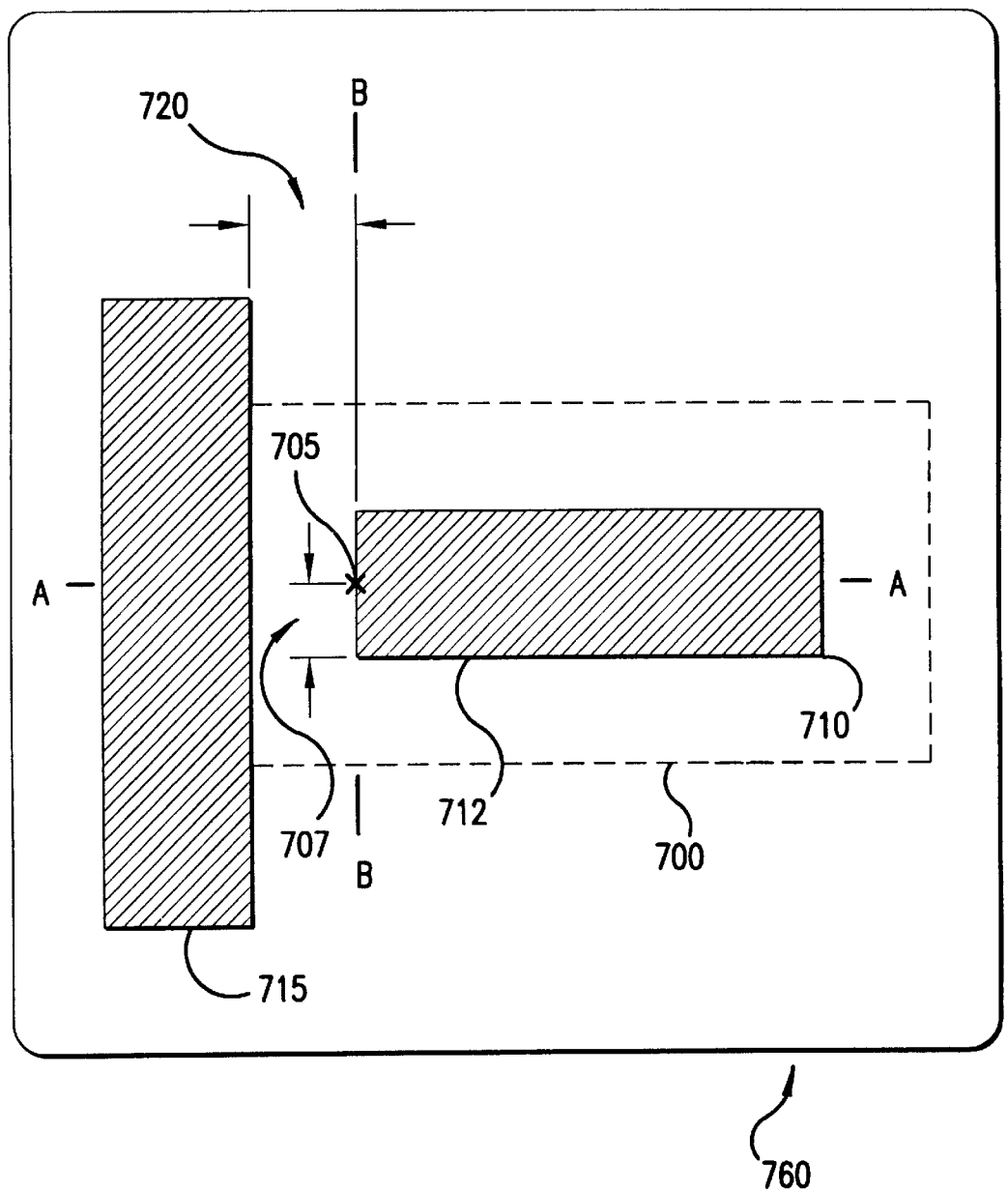
FIG. 7A is a drawing of a computer monitor display generated by a CAD software program showing a design rule halo, design feature, and cursor just prior to a 90 degree bend in design feature.

In another representative embodiment, FIG. 7A is a drawing of the display of a computer monitor 760 generated by the CAD software program 165,265. In this drawing, a first-design feature 710, also referred to as a design feature 710, and a second-design feature 715 are displayed on the computer monitor 760. The first-design feature 710 is shown with a design-rule halo 700, also referred to herein as a turn-adaptable-design-rule halo 700, and with a cursor 705 placed at one end of the first-design feature 710 and lying on an axis-of-motion A—A of the first-design feature 710. The end of the first-design feature 710 at which the cursor 705 is located moves with movement of the cursor 705 which in turn moves with movement of the cursor-movement device 170. A lateral edge 712 of the first-design feature 710 is located a cursor-to-lateral-edge distance 707 from the cursor 705. The first-design feature 710 has been placed so that the first-design feature 710 and the second-design feature 715 are separated by a design-rule distance 720 as indicated by the overlaying of the outline of the design-rule halo 700 and the edge of the second-design feature 715. A second-axis-of-motion B—B directed at a right angle to the axis-of-motion A—A is also shown passing through the cursor 705.

Figure 7B:
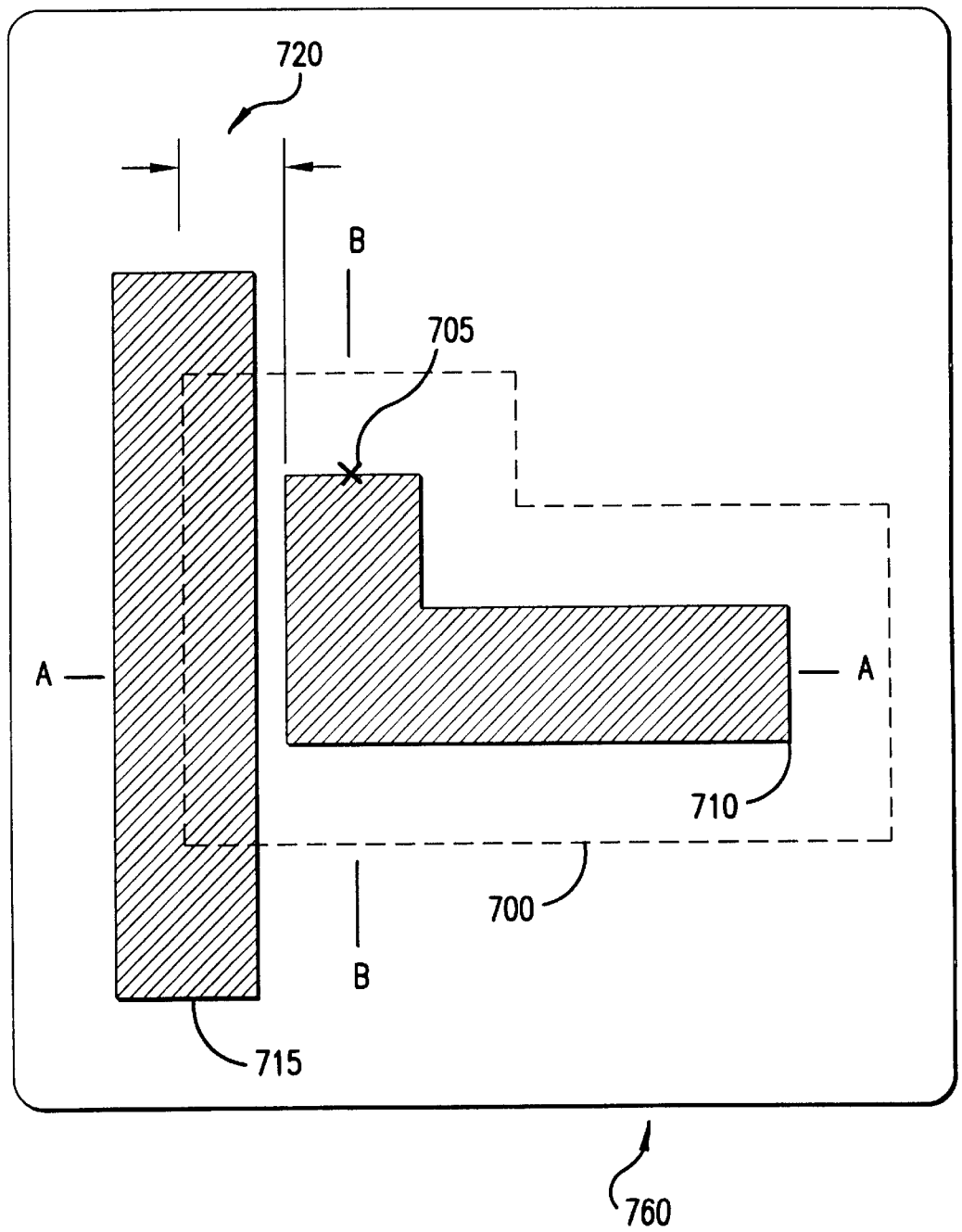
FIG. 7B is a drawing of a computer monitor display generated by a CAD software program showing the features of FIG. 7A following a 90 degree bend in a design feature.

FIG. 7B is a redrawing of FIG. 7A of the display of the computer monitor 760 following a movement of the cursor 705 past a predefined threshold and along the second-axis-of-motion B—B which for this example embodiment is rotated 90 degrees from the axis-of-motion A—A. However, the second-axis-of-motion B—B could be rotated at any angle, including 45 degrees, from the axis-of-motion A—A. Maintaining a constant width, the first-design feature 710 has been modified to reflect its change in response to the movement of the cursor 705. The far left side of the turn-adaptable-design-rule halo 700 has been adjusted to maintain the design-rule distance 720 from the first-design feature 710. The turn-adjustable-design-rule halo 700 now overlaps the second-design feature 715 indicating a violation of the intra-level design rule.

In this representative embodiment, block 282 of FIG. 2 uses the design rule information obtained in block 280 to define the initial locus on the computer monitor 160,760 of the turn-adaptable-design-rule halo 700 as shown in FIG. 7A.

Figure 7C:
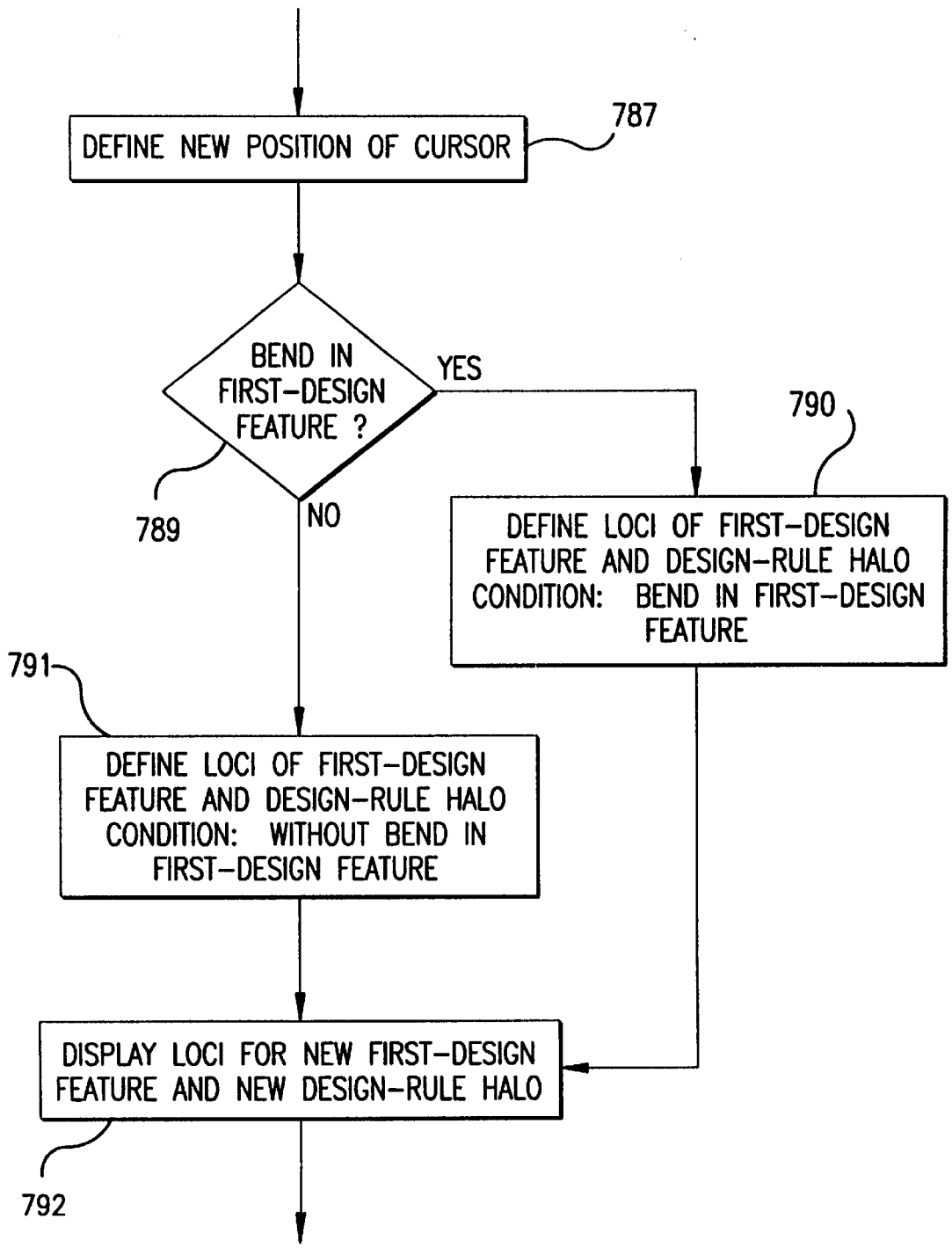
FIG. 7C is a flow chart of a part of a CAD software program of a representative embodiment for creating, on a computer monitor, a design rule halo which follows a bend in a design feature.

Block 286 of the flow chart is further defined by the flow chart in FIG. 7C. Block 787 defines the new position of the cursor 705 following movement of the cursor-movement device 170. Block 787 then transfers control to block 789.

If a bend or turn of greater than a predefined threshold level occurred in the first-design feature 710, control is transferred to block 790, otherwise control is transferred to block 791.

Block 790 defines the loci of the first-design feature 710 and the design-rule halo 700 for a bend in the first-design feature 710. Block 790 then transfers control to block 792.

Block 791 defines the locus of the design-rule halo 700 for an operation on the first-design feature 710 which does not involve a bend past a pre-defined threshold level. Block 791 then transfers control to block 792.

Block 792 displays the loci for the new first-design feature 710 and the new design-rule halo 700. Program execution continues by looping from block 787 through block 792 until the selected operation is completed by the operator. Block 792 then transfers control to block 299 shown in FIG. 2.

Other possible actions include, but are not limited to, creation, movement of the cursor-movement device 170 in arbitrary directions, changes in size, changes in location—often accomplished by dragging and dropping, copying, and deletion of the first-design feature 710 and the design-rule halo 700.

In a representative embodiment, the method steps described above may include a more extensive software program which could include, for example, other method steps such as storage and retrieval of interrelated design features, as well as those mentioned above. In the event of a design rule violation, the method steps described above also may include providing various visual indications of such including alternately changing the intensity of the design-rule halo 700, changing the color of the design-rule halo 700, changing the line pattern of the design-rule halo 700 outline, changing the design-rule halo 700 fill pattern, and providing a message to the user indicating which design rule has been violated. Additionally, in the event of a design rule violation, the method steps described above may include providing various audio indications of such including a sound of varying intensity, the sound of a bell, the sound of a whistle, and a message delivered by recorded voice.

Figure 8A:
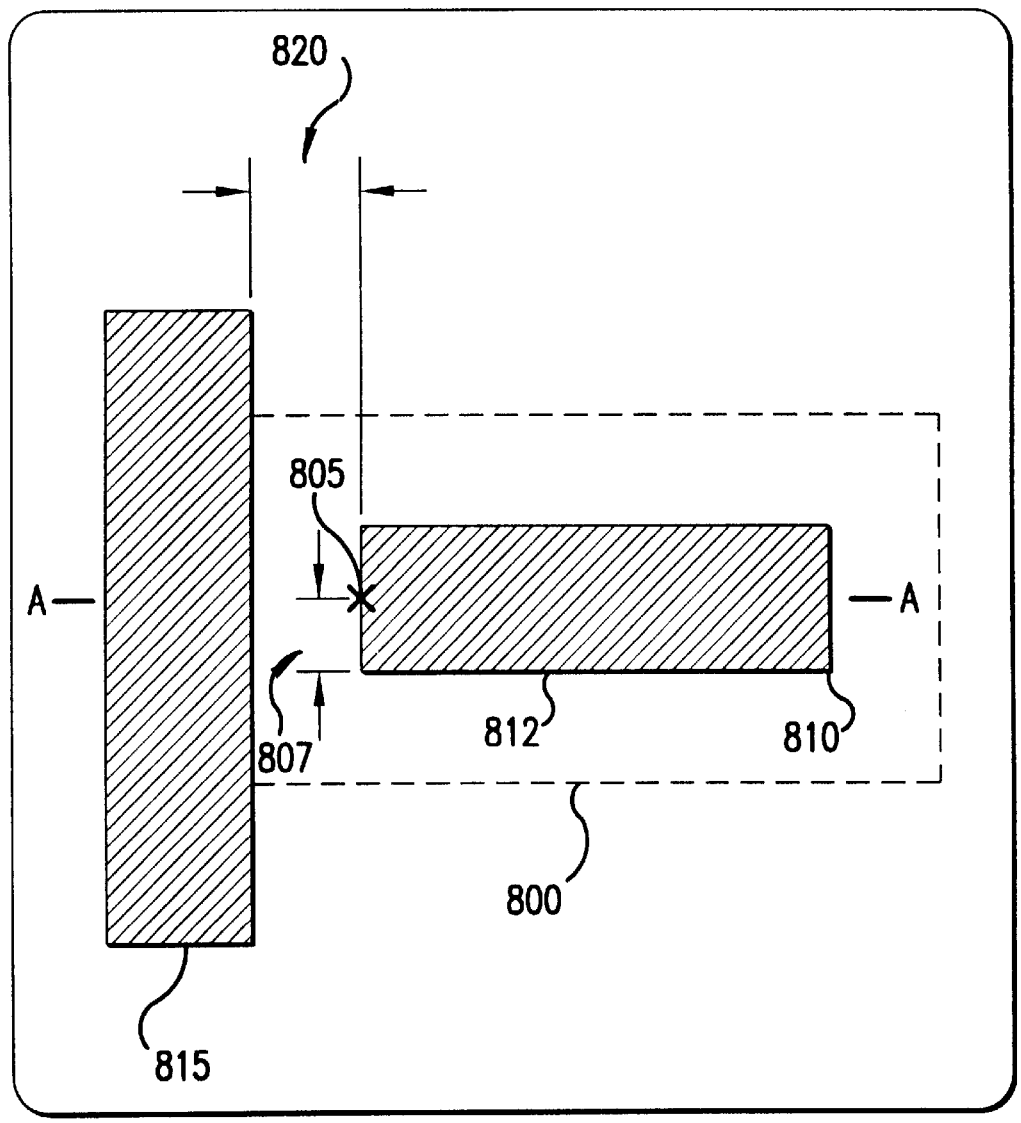
FIG. 8A is a drawing of a computer monitor display generated by a CAD software program showing a design rule halo, design feature, and cursor just prior to a 90 degree bend in design feature in accordance with the teachings of the present patent document.

In another representative embodiment, FIG. 8A is a drawing of the display of a computer monitor 860 generated by the CAD software program 165,265. In this drawing, a first-design feature 810, also referred to herein as a design feature 810, and a second-design feature 815 are displayed on the computer monitor 860. The first-design feature 810 is shown with a design-rule halo 800, also referred to as a snap-back-design-rule halo 800, and with a cursor 805 placed at one end of the first-design feature 810 and lying on an axis-of-motion A—A of the first-design feature 810. The end of the first-design feature 810 at which the cursor 805 is located moves with movement of the cursor 805. A lateral edge 812 of the first-design feature 810 is located a cursor-to-lateral-edge distance 807 from the cursor 805. Note that the first-design feature 810 has been placed so that the first-design feature 810 and the second-design feature 815 are separated by a design-rule distance 820 as indicated by the overlaying of the outline of the design-rule halo 800 and the edge of the second-design feature 815.

Figure 8B:
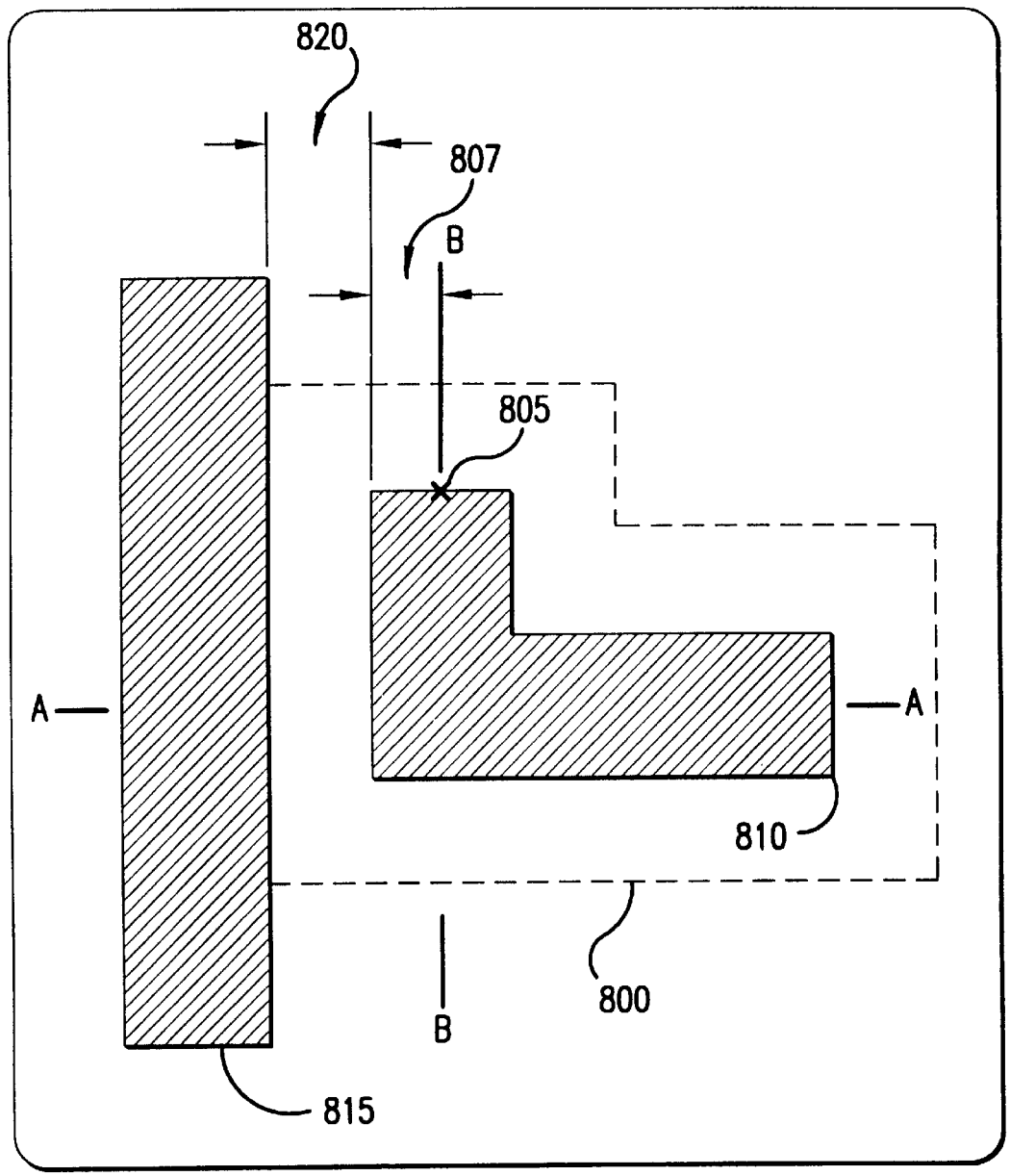
FIG. 8B is a drawing of a computer monitor display generated by a CAD software program showing the features of FIG. 8A following a 90 degree bend in a design feature.

FIG. 8B is a redrawing of FIG. 8A of the display of the computer monitor 860 following a movement of the cursor 805 parallel to a second-axis-of-motion B—B which in this embodiment is perpendicular to the axis A—A. Following the movement of the cursor 805 parallel to the second-axis-of-motion B—B, the cursor 805 and associated first-design feature 810 shift away from the second-design feature 815 by a distance equal to the cursor-to-lateral-edge distance 807. The first-design feature 810 has been modified to reflect changes in response to the movement of the cursor 805. The far left side of the snap-back-design-rule halo 800 has been adjusted to maintain the design-rule distance 820 between the first-design feature 810 and the second-design feature 815. The far left edge of the snap-back-design-rule halo 800 overlaps the right edge of the second-design feature 815 indicating that the intra-level design rule is not violated.

In this representative embodiment, block 282 of FIG. 2 uses the design rule information obtained in block 280 to define the initial locus on the computer monitor 160,860 of the snap-back-design-rule halo 800 as shown in FIG. 8A.

Figure 8C:
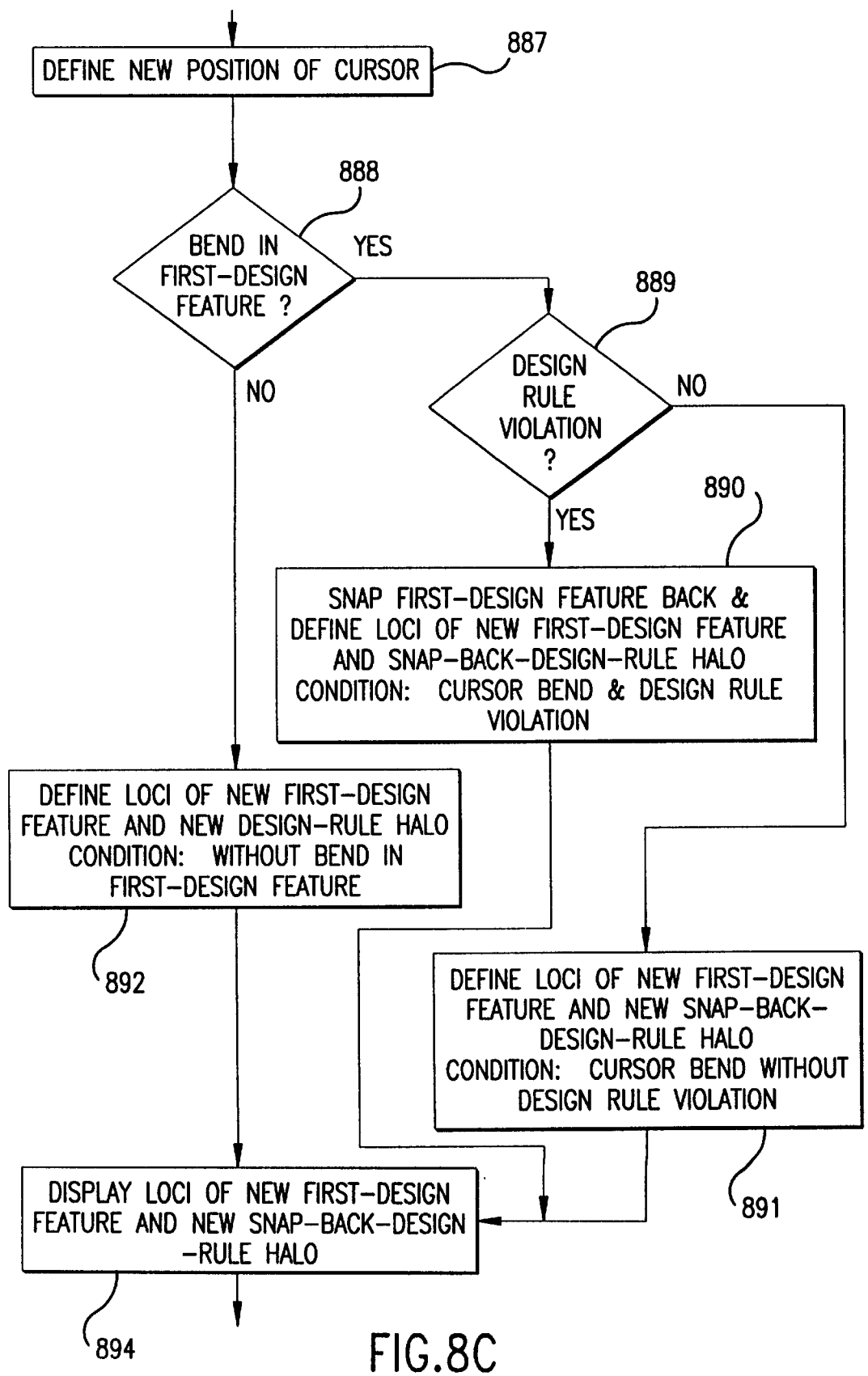
FIG. 8C is a flow chart of a part of a CAD software program of a representative embodiment for creating, on a computer monitor, a design rule halo and a design feature which is forced to conform to design rules following a bend in the design feature.

Block 286 of the flow chart is further defined by the flow chart in FIG. 8C. Block 887 defines the new position of the cursor 805 following movement of the cursor-movement device 170. Block 887 then transfers control to block 888.

If a bend or turn of greater than a predefined threshold level occurred in the movement of the cursor 805, control is transferred to block 889, otherwise control is transferred to block 892.

If a design rule violation occurs following the movement of the cursor 805, control is transferred to block 890, otherwise control is transferred to block 891.

Block 890 snaps the first-design feature back in order to avoid a design rule violation following the bend. The new loci of the first-design feature 810 and the snap-back-design-rule halo 800 are defined. Control is then transferred to block 894.

Block 891 creates the new loci of the first-design feature 810 and the design-rule halo 800. The cursor remains at the same distance from the second-design feature 815 since a violation of the design rules did not occur due to the bend in the movement of the cursor 805. Control is then transferred to block 894.

Block 892 creates the new loci of the first-design feature 810 and the design-rule halo 800 in response to movement without a bend of the cursor 805. Control is then transferred to block 894.

Block 894 displays the loci for the new first-design feature 810 and the new design-rule halo 800. Program execution continues by looping from block 887 through block 894 until the selected operation is completed by the operator. Block 894 then transfers control to block 299 in FIG. 2.

Other possible actions include, but are not limited to, creation, movement of the cursor-movement device 170 in arbitrary directions, changes in size, changes in location—often accomplished by dragging and dropping, copying, and deletion of the first-design feature 810 and the design-rule halo 800.

In a representative embodiment, the method steps described above may include a more extensive software program which could include for example, other method steps such as storage and retrieval of interrelated design features, as well as those mentioned above. In the event of an attempted design rule violation, the method steps described above also may include providing various visual indications of such including alternately changing the intensity of the design-rule halo 800, changing the color of the design-rule halo 800, changing the line pattern of the design-rule halo 800 outline, changing the design-rule halo 800 fill pattern, and providing a message to the user indicating which design rule has been violated. Additionally, in the event of a design rule violation, the method steps described above may include providing various audio indications of such including a sound of varying intensity, the sound of a bell, the sound of a whistle, and a message delivered by recorded voice.

Figure 9A:
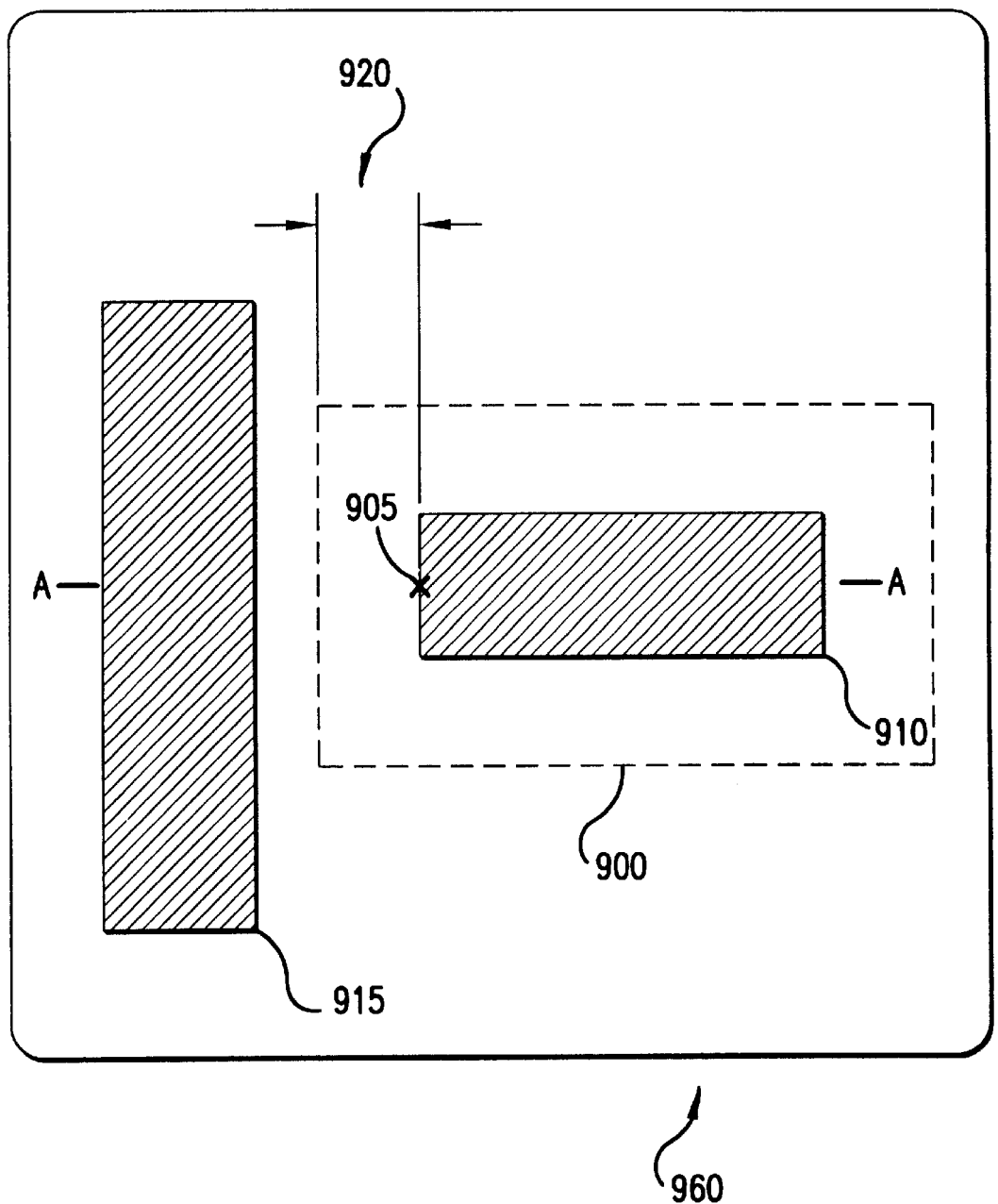
FIG. 9A is a drawing of a computer monitor display generated by a CAD software program showing a design rule halo, cursor, and design feature located more than a design rule distance from an adjacent design feature.

In another representative embodiment, FIG. 9A is a drawing of the display of a computer monitor 960 generated by the CAD software program 165,265. In this drawing, a first-design feature 910, also referred to herein as a design feature 910, and a second-design feature 915 are displayed on the computer monitor 960. The first-design feature 910 is shown with a design-rule halo 900 at a design-rule distance 920 from the first-design feature 900. A cursor 905 is placed at one end of the first-design feature 910 and lies on an axis-of-motion A—A for the first-design feature 910. The end of the first-design feature 910 at which the cursor 905 is located moves with movement of the cursor 905 along the axis of motion A—A.

Figure 9B:
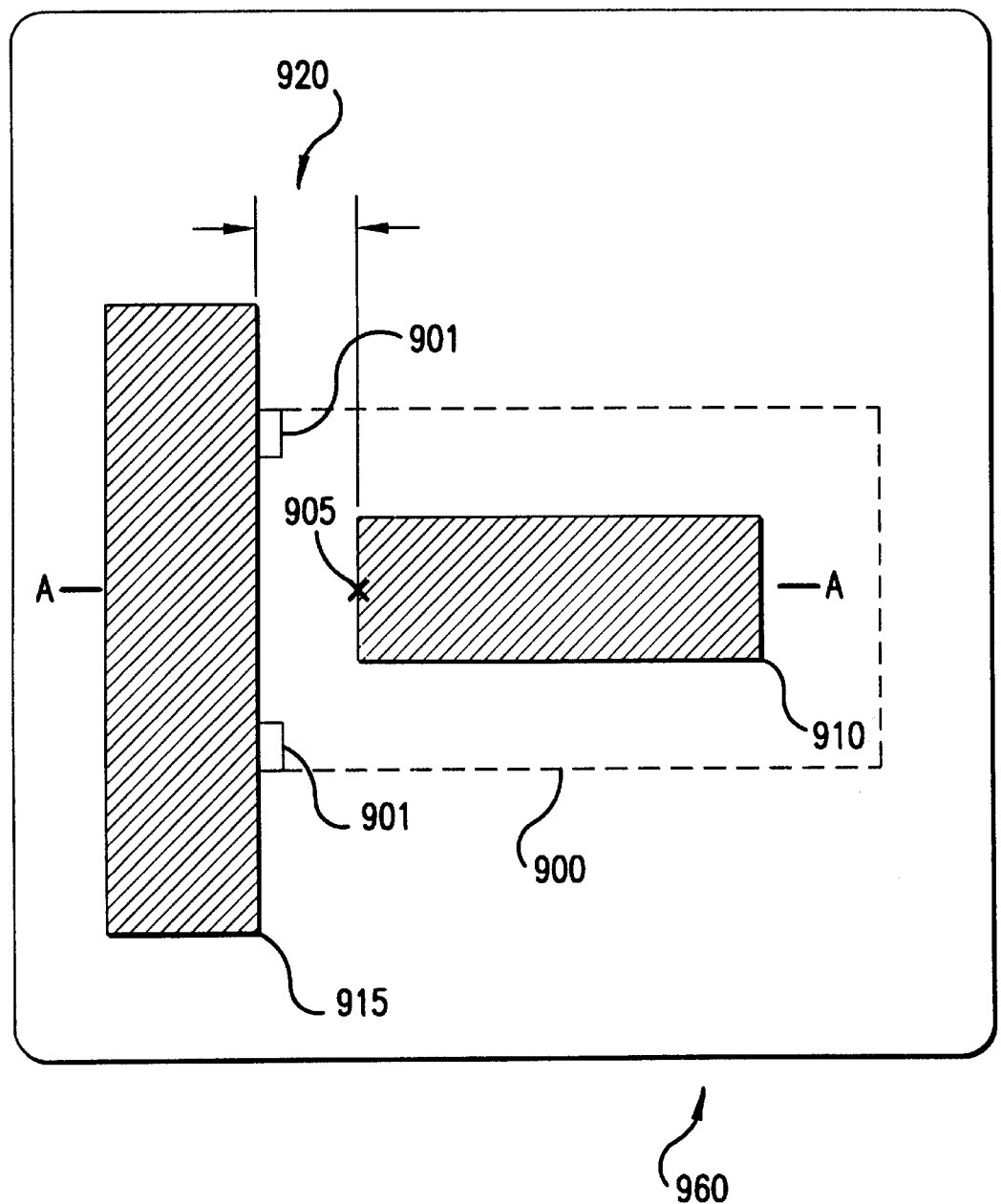
FIG. 9B is a drawing of a computer monitor display generated by a CAD software program showing the features of FIG. 9A after stretching a design feature to the design rule distance from the adjacent design feature.

FIG. 9B is a redrawing of FIG. 9A of the display of the computer monitor 960 following a movement to the left of the cursor 905 along the axis-of-motion A—A to within the design-rule distance 920 of the second-design feature 915. Upon reaching the position shown in FIG. 9B, the cursor 905 cannot be moved further to the left and, in a representative embodiment, visual-stop indicators 901 appear on the monitor to indicate to the operator that the design rule minimum distance has been reached. Other visual indicators, such as the flashing of the design-rule halo 900, a change in the line pattern of the design-rule halo 900, a change in the color of the design-rule halo 900, a change in the fill pattern of the design-rule halo 900, a message displayed on the computer monitor 960, or simply failure of the design-rule halo 900 to expand further are also possible. Audio indicators including a sound of varying intensity, the sound of a bell, the sound of a whistle, and a message delivered by recorded voice can also be used.

Two features can be brought closer together than the design-rule distance 920 by pressing predefined key or keys on the computer keyboard. In this manner, two adjacent features can be connected.

In this representative embodiment, block 282 of FIG. 2 uses the design rule information obtained in block 280 to define the initial locus on the computer monitor 160,960 of the design-rule halo 900 as shown in FIG. 9A.

Figure 9C:
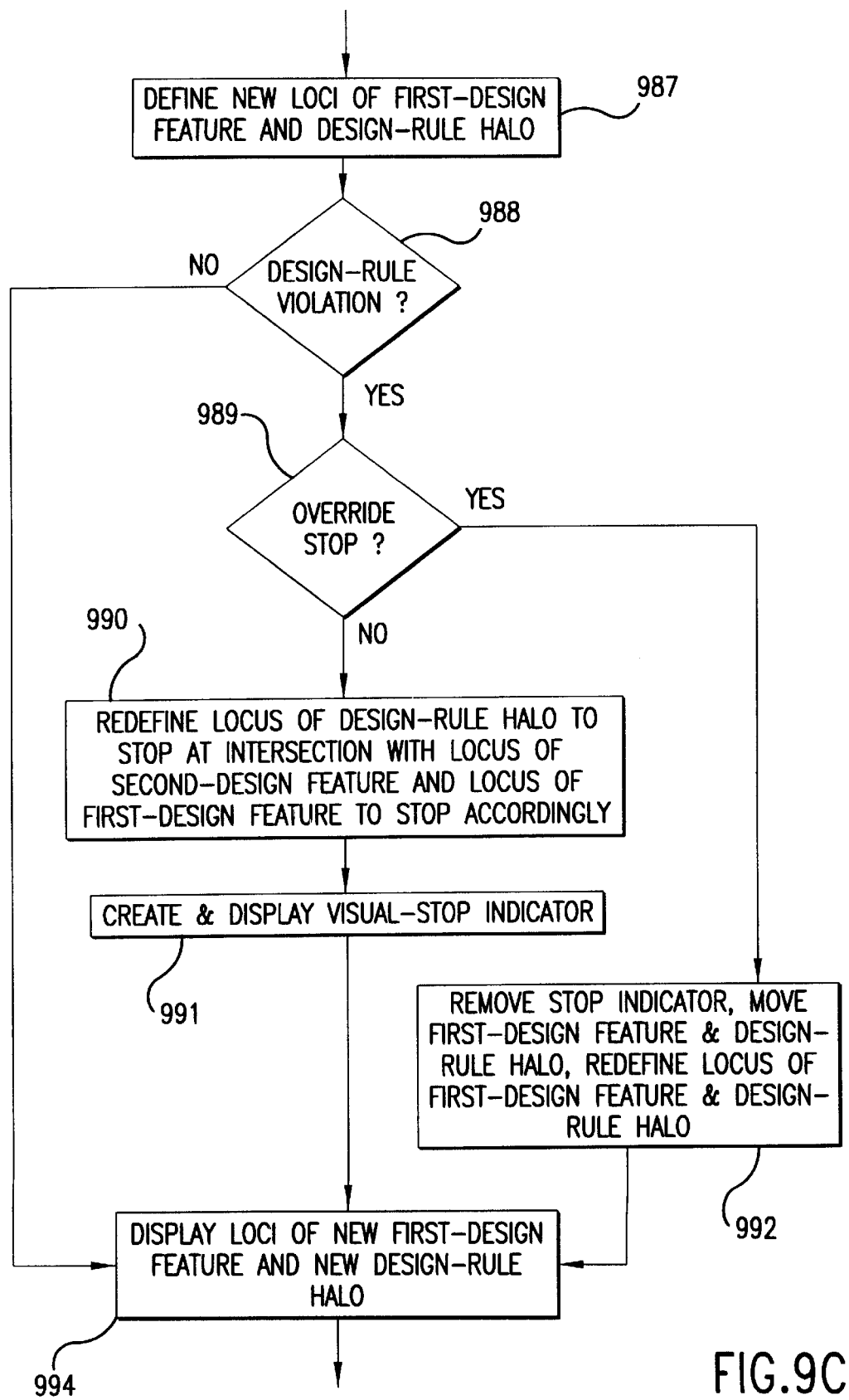
FIG. 9C is a flow chart of a part of a CAD software program of a representative embodiment for creating, on a computer monitor, a design rule halo which prevents design rule space violation between two adjacent design features.

Block 286 of the flow chart of FIG. 2 is further defined by the flow chart in FIG. 9C. Block 987 defines the new position of the cursor 905 following movement of the cursor-movement device 170. Block 987 then transfers control to block 988.

If a design rule is violated, control is transferred to block 989, otherwise control is transferred to block 994.

Block 989 redefines the locus of the design-rule halo 900 to stop at its intersection with the locus of the second-design feature 915 and the locus of the first-design feature 910 to stop accordingly. Block 989 then transfers control to block 990.

Block 990 creates and displays in one embodiment the visual-stop indicator 901 and in another embodiment an audio-stop indicator. Control is then transferred to block 991.

If an override of the movement stop of the first-design feature is activated, block 991 transfers control to block 992, otherwise block 991 transfers control to block 994.

Block 992 removes the visual-stop indicator 901, allows the first-design feature 910 and the design-rule halo 900 to follow movement of the cursor-movement device 170, and redefines the locus of the first-design feature 910 and the design-rule halo 900. Block 992 then transfers control to block 994.

Block 994 displays the loci for the new first-design feature 910 and the new design-rule halo 900. Program execution continues by looping from block 987 through block 994 until the selected operation is completed by the operator. Block 994 then transfers control to block 299 of FIG. 2.

Other possible actions include, but are not limited to, creation, movement of the cursor-movement device 170 in arbitrary directions, changes in size, changes in location—often accomplished by dragging and dropping, copying, and deletion of the first-design feature 710 and the design-rule halo 700.

In a representative embodiment, the method steps described above may include a more extensive software program which could include, for example, other method steps such as storage and retrieval of interrelated design features, as well as those mentioned above. In the event of a design rule violation, the method steps described above also may include providing various visual indications of such including alternately changing the intensity of the design-rule halo 900, changing the color of the design-rule halo 900, changing the line pattern of the design-rule halo 900 outline, changing the design-rule halo 900 fill pattern, and providing a message to the user indicating which design rule has been violated. Additionally, in the event of a design rule violation, the method steps described above may include providing various audio indications of such including a sound of varying intensity, the sound of a bell, the sound of a whistle, and a message delivered by recorded voice.

As shown in the drawings for purposes of illustration, the present patent document relates to novel computer monitor displays of design-rule halos used in Computer Aided Design (CAD) software programs. Beveled-corner-design-rule halos provide better visual aid for the closer placement of some design features than has been previously possible. Also, level-to-level design-rule halos can be used in conjunction with intra-level design-rule halos to indicate design rule spacings for multiple levels. Design-rule halos associated with design patterns indicate design rule violations following arbitrary angular bends in the design feature. In another embodiment, design patterns which make arbitrary angular bends are automatically moved to conform to design rules. In addition, representative embodiments have design features that are restricted from violating a design rule. From the foregoing it will be appreciated that the invention provides numerous, novel advantages not previously available.

Although several specific embodiments of the invention have been described and illustrated, the invention is not to be limited to the specific forms or arrangements of parts so described and illustrated. The invention is limited only by the claims.

What is claimed is:

1. A computer system comprising:
    (a) a computer;
    (b) a computer monitor coupled to the computer displaying a design feature and a design-rule halo, wherein the design-rule halo is located at a design-rule distance from the design feature and wherein the design-rule halo substantially surrounds the design feature;
    (c) a cursor-movement device coupled to the computer, wherein the cursor-movement device moves a cursor displayed on the computer monitor and wherein the cursor is located substantially on one end of the design feature: and
    (d) a CAD software program operating on the computer for controlling the outline and location of the design feature and the design-rule halo on the computer monitor, wherein said design-rule halo is associated with the design feature and said design-rule halo automatically adjusts to a design-rule distance from the design feature following a bend in the design feature.

2. The computer system of claim 1, wherein movement of the cursor-movement device results in the CAD software program moving the design feature and the design-rule halo from one location to another on the computer monitor.

3. The computer system of claim 2 wherein the CAD software program further comprises:
    (a) instructions for obtaining design-rule information;
    (b) instructions for obtaining the location and outline of the design feature;
    (c) instructions for defining the design-rule halo;
    (d) instructions for displaying the design feature on the computer monitor; and
    (e) instructions for displaying the design-rule halo on the computer monitor.

4. The computer system of claim 3 wherein the CAD software program further comprises:
    (a) instructions for defining the new position of a cursor moved in response to movement of the cursor-movement device; and
    (b) instructions when a bend occurs in the design feature, said design-rule halo automatically adjusting further includes,
        defining the new location and outline of the design feature following the bend in said design feature; and
        defining the new location and outline of the design-rule halo to be such that it is displayed the design-rule distance from the design feature having a bend;
    and instructions when a bend does not occur in the design feature, define the new location and outline of the design feature; and
    define the new location and outline of the design-rule halo.

5. The computer system of claim 1, wherein movement of the cursor-movement device results in the CAD software program changing the outline of the design feature and the design-rule halo on the computer monitor.

6. The computer system of claim 5 wherein the CAD software program further comprises:
    (a) instructions for obtaining design-rule information;
    (b) instructions for obtaining the location and outline of the design feature;
    (c) instructions for defining the design-rule halo;
    (d) instructions for displaying the design feature on the computer monitor; and
    (e) instructions for displaying the design-rule halo on the computer monitor.

7. The computer system of claim 6 wherein the CAD software program further comprises:
    (a) instructions for defining the new position of a cursor moved in response to movement of the cursor-movement device; and (b) instructions when a bend occurs in the design feature, said design-rule halo automatically adjusting further includes, defining the new location and outline of the design feature following the bend in said design feature; and defining the new location and outline of the design-rule halo to be such that it is displayed the design-rule distance from the design feature having a bend;

and instructions when a bend does not occur in the design feature, define the new location and outline of the design feature; and define the new location and outline of the design-rule halo.

8. A computer operable method for displaying a design-rule halo on a computer monitor, comprising the steps of:

(a) obtaining design-rule information defining the relationship of the outline of the design-rule halo to the outline of a design feature, associated with the design-rule halo;

(b) defining the outline and location of the design feature;

(c) defining a cursor located substantially on one end of the design feature, wherein the cursor moves in response to movement of a cursor-movement device;

(d) defining the outline and location of the design-rule halo on the computer monitor, said computer monitor attached to a computer, said design-rule halo located at a design-rule distance from the design feature said design-rule halo substantially surrounding the design feature and said design-rule halo automatically adjusting to a design-rule distance in placement from the design feature following a bend in the design feature;

(e) displaying the design feature on the computer monitor; and (f) displaying the design-rule halo on the computer monitor.

9. The method steps as in claim 8 further comprising:

moving the design feature and the design-rule halo, said design-rule halo associated with the design feature, from one location to another on the computer monitor in response to inputs from a cursor-movement device attached to the computer.

10. The method steps as in claim 9 further comprising:

(a) defining the new position of a cursor moved in response to movement of the cursor-movement device; and (b) when a bend occurs in the design feature, defining the new location and outline of the design feature following the bend in said design feature; and defining the new location and outline of the design-rule halo, said design-rule halo automatically adjusting the design-rule distance from the design feature following the bend in the design feature;

and when a bend does not occur in the design feature, defining the new location and outline of the design feature; and defining the new location and outline of the design-rule halo.

11. The method steps as in claim 8 further comprising:

changing the outline of the design feature and the design-rule halo, said design-rule halo associated with the design feature, on the computer monitor in response to inputs from a cursor-movement device attached to the computer.

12. The method steps as in claim 11 further comprising:

(a) defining the new position of a cursor moved in response to movement of the cursor-movement device; and (b) when a bend occurs in the design feature, defining the new location and outline of the design feature following the bend in said design feature; and defining the new location and outline of the design-rule halo, said design-rule halo automatically adjusting the design-rule distance from the design feature following the bend in the design feature;

and when a bend does not occur in the design feature, defining the new location and outline of the design feature; and defining the new location and outline of the design-rule halo.

13. A program-storage medium readable by a computer, tangibly embodying a CAD software program executable by the computer to perform method steps for displaying a design-rule halo on a computer monitor, said steps comprising:

(a) obtaining design-rule information defining the relationship of the outline of the design-rule halo to the outline of a design feature, associated with the design-rule halo;

(b) defining the outline and location of the design feature;

(c) defining a cursor located on the design feature, wherein the cursor moves in response to movement of a cursor-movement device:

(d) defining the outline and location of the design-rule halo on the computer monitor, said computer monitor attached to a computer, said design-rule halo located at a design-rule distance from the design feature, said design-rule halo substantially surrounding the design feature, and said design-rule halo automatically adjusting to a design-rule distance in placement from the design feature following a bend in the design feature;

(e) displaying the design feature on the computer monitor; and (f) displaying the design-rule halo on the computer monitor.

14. The program-storage medium as in claim 13 wherein:

the method steps further comprise moving the design feature and the design-rule halo, said design-rule halo associated with the design feature, from one location to another on the computer monitor in response to inputs from a cursor-movement device attached to the computer.

15. The program-storage medium as in claim 14 wherein the method steps further comprise:

(a) defining the new position of a cursor moved in response to movement of the cursor-movement device; and (b) when a bend occurs in the design feature, defining the new location and outline of the design feature following the bend in said design feature; and defining the new location and outline of the design-rule halo, said design-rule halo automatically adjusting the design-rule distance from the design feature following the bend in the design feature;

and when a bend does not occur in the design feature, defining the new location and outline of the design feature; and defining the new location and outline of the design-rule halo.

16. The program-storage medium as in claim 13 wherein:
   the method steps further comprise changing the outline of the design feature and the design-rule halo, said design-rule halo associated with the design feature, on the computer monitor in response to inputs from a cursor-movement device attached to the computer.

17. The program-storage medium as in claim 16 wherein the method steps further comprise:
   (a) defining the new position of a cursor moved in response to movement of the cursor-movement device; and
   (b) when a bend occurs in the design feature,
      defining the new location and outline of the design feature following the bend in said design feature; and
      defining the new location and outline of the design-rule halo, said design-rule halo automatically adjusting the design-rule distance from the design feature following the bend in the design feature;
   and when a bend does not occur in the design feature,
      defining the new location and outline of the design feature; and
      defining the new location and outline of the design-rule halo.

18. A computer system comprising:
   (a) a computer;
   (b) a computer monitor coupled to the computer for displaying a design feature and a design-rule halo; and
   (c) a CAD software program operating on the computer for controlling the outline and location of the design feature and the design-rule halo on the computer monitor, wherein said design-rule halo is associated with the design feature and automatically snaps to a design-rule distance from a second-design feature when required to ensure non-violation of design rules between the design feature and the second-design feature following a bend in the design feature.

19. The computer system of claim 18 further comprising:
   a cursor-movement device coupled to the computer, wherein movement of the cursor-movement device results in the CAD software program moving the design feature and the design-rule halo on the computer monitor.

20. The computer system of claim 19 wherein the CAD software program further comprises:
   (a) instructions for obtaining design-rule information;
   (b) instructions for obtaining the location and outline of the design feature;
   (c) instructions for defining the design-rule halo;
   (d) instructions for displaying the design feature on the computer monitor; and
   (e) instructions for displaying the design-rule halo on the computer monitor.

21. The computer system of claim 20 wherein the CAD software program further comprises:
   (a) instructions for defining the new position of a cursor moved in response to movement of the cursor-movement device;
   (b) instructions when a bend occurs in the design feature, and instructions when the design rule is violated,
      for defining the new location and outline of the design feature following a movement of the design feature such that the design feature is located a design-rule distance from a second-design feature; and
      for defining the new location and outline of the design-rule halo;
   and instructions when the design rule is not violated,
      for defining the new location and outline of the design feature following a bend without movement of the design feature to a location the design-rule distance from the second-design feature; and
      for defining the new location and outline of the design-rule halo;
   and instructions when a bend does not occur in the design feature,
      for defining the new location and outline of the design feature following a bend without movement of the design feature to a location the design-rule distance from the second-design feature; and
      for defining the new location and outline of the design-rule halo; and
   (c) instructions for displaying the location and outline of the design feature and the design-rule halo.

22. The computer system of claim 18 further comprising:
   a cursor-movement device coupled to the computer, wherein movement of the cursor-movement device results in the CAD software program changing the outline of the design feature and the design-rule halo on the computer monitor.

23. The computer system of claim 22 wherein the CAD software program further comprises:
   (a) instructions for obtaining design-rule information;
   (b) instructions for obtaining the outline and location of the design feature;
   (c) instructions for defining the design-rule halo;
   (d) instructions for displaying the design feature on the computer monitor; and
   (e) instructions for displaying the design-rule halo on the computer monitor.

24. The computer system of claim 23 wherein the CAD software program further comprises:
   (a) instructions for defining the new position of a cursor moved in response to movement of the cursor-movement device;
   (b) instructions when a bend occurs in the design feature, and instructions when the design rule is violated,
      for defining the new location and outline of the design feature following a movement of the design feature such that the design feature is located a design-rule distance from a second-design feature; and
      for defining the new location and outline of the design-rule halo;
   and instructions when the design rule is not violated,
      for defining the new location and outline of the design feature following a bend without movement of the design feature to a location the design-rule distance from the second-design feature; and
      for defining the new location and outline of the design-rule halo;
   and instructions when a bend does not occur in the design feature,
      for defining the new location and outline of the design feature following a bend without movement of the design feature to a location the design-rule distance from the second-design feature; and
      for defining the new location and outline of the design-rule halo; and
   (c) instructions for displaying the location and outline of the design feature and the design-rule halo.

25. A computer operable method for displaying a design-rule halo on a computer monitor, comprising the steps of:

(a) obtaining design-rule information defining the relationship of the outline of the design-rule halo to the outline of a design feature, associated with the design-rule halo;

(b) defining the outline and location of the design feature;

(c) defining the outline and location of the design feature, said design feature automatically adjusting to a design-rule distance in placement from a second-design feature when required to ensure non-violation of design rules between the design feature and the second-design feature following a bend in the design feature;

(d) displaying the design feature on the computer monitor; and (e) displaying the design-rule halo on the computer monitor.

26. The method steps as in claim 25 further comprising:

moving the design feature and the design-rule halo, said design-rule halo associated with the design feature, on the computer monitor in response to inputs from a cursor-movement device attached to the computer.

27. The method steps as in claim 26 further comprising:

(a) defining the new position of a cursor moved in response to movement of the cursor-movement device;

(b) when a bend occurs in the design feature, and when the design rule is violated, defining the new location and outline of the design feature following a movement of the design feature such that the design feature is located a design-rule distance from a second-design feature; and defining the new location and outline of the design-rule halo;

and when the design rule is not violated, defining the new location and outline of the design feature following a bend without movement of the design feature to a location the design-rule distance from the second-design feature; and defining the new location and outline of the design-rule halo;

and when a bend does not occur in the design feature, defining the new location and outline of the design feature following a bend without movement of the design feature to a location the design-rule distance from the second-design feature; and defining the new location and outline of the design-rule halo; and (c) displaying the location and outline of the design feature and the design-rule halo.

28. The method steps as in claim 25 further comprising:

changing the outline of the design feature and the design-rule halo, said design-rule halo associated with the design feature, on the computer monitor in response to inputs from a cursor-movement device attached to the computer.

29. The method steps as in claim 28 further comprising:

(a) defining the new position of a cursor moved in response to movement of the cursor-movement device;

(b) when a bend occurs in the design feature, and when the design rule is violated, defining the new location and outline of the design feature following a movement of the design feature such that the design feature is located a design-rule distance from a second-design feature; and defining the new location and outline of the design-rule halo;

and when the design rule is not violated, defining the new location and outline of the design feature following a bend without movement of the design feature to a location the design-rule distance from the second-design feature; and defining the new location and outline of the design-rule halo;

and when a bend does not occur in the design feature, defining the new location and outline of the design feature following a bend without movement of the design feature to a location the design-rule distance from the second-design feature; and defining the new location and outline of the design-rule halo; and (c) displaying the location and outline of the design feature and the design-rule halo.

30. A program-storage medium readable by a computer, tangibly embodying a CAD software program executable by the computer to perform method steps for displaying a design-rule halo on a computer monitor, said steps comprising:

(a) obtaining design-rule information defining the relationship of the outline of the design-rule halo to the outline of a design feature, associated with the design-rule halo;

(b) defining the outline and location of the design feature;

(c) defining the outline and location of the design feature, said design feature automatically adjusting to a design-rule distance in placement from a second-design feature when required to ensure non-violation of design rules between the design feature and the second-design feature following a bend in the design feature;

(d) displaying the design feature on the computer monitor; and (e) displaying the design-rule halo on the computer monitor.

31. The program-storage medium as in claim 30 wherein:

the method steps further comprise moving the design feature and the design-rule halo, said design-rule halo associated with the design feature, on the computer monitor in response to inputs from a cursor-movement device attached to the computer.

32. The program-storage medium as in claim 31 wherein the method steps further comprise:

(a) defining the new position of a cursor moved in response to movement of the cursor-movement device;

(b) when a bend occurs in the design feature, and when the design rule is violated, defining the new location and outline of the design feature following a movement of the design feature such that the design feature is located a design-rule distance from a second-design feature; and defining the new location and outline of the design-rule halo;

and when the design rule is not violated, defining the new location and outline of the design feature following a bend without movement of the design feature to a location the design-rule distance from the second-design feature; and defining the new location and outline of the design-rule halo;

and when a bend does not occur in the design feature, defining the new location and outline of the design feature following a bend without movement of the design feature to a location the design-rule distance from the second-design feature; and defining the new location and outline of the design-rule halo; and (c) displaying the location and outline of the design feature and the design-rule halo.

33. The program-storage medium as in claim 30 wherein:

the method steps further comprise changing the outline of the design feature and the design-rule halo, said design-rule halo associated with the design feature, on the computer monitor in response to inputs from a cursor-movement device attached to the computer.

34. The program-storage medium as in claim 33 wherein the method steps further comprise:

(a) defining the new position of a cursor moved in response to movement of the cursor-movement device;

(b) when a bend occurs in the design feature, and when the design rule is violated, defining the new location and outline of the design feature following a movement of the design feature such that the design feature is located a design-rule distance from a second-design feature; and defining the new location and outline of the design-rule halo;

and when the design rule is not violated, defining the new location and outline of the design feature following a bend without movement of the design feature to a location the design-rule distance from the second-design feature; and defining the new location and outline of the design-rule halo;

and when a bend does not occur in the design feature, defining the new location and outline of the design feature following a bend without movement of the design feature to a location the design-rule distance from the second-design feature; and defining the new location and outline of the design-rule halo; and (c) displaying the location and outline of the design feature and the design-rule halo.

* * * * *